US012690433B2

(12) United States Patent
Chung et al.

(10) Patent No.: US 12,690,433 B2
(45) Date of Patent: Jul. 21, 2026

(54) LOW RESISTANCE INTERCONNECT FEATURES AND METHOD FOR MANUFACTURING THE SAME

(71) Applicant: TAIWAN SEMICONDUCTOR MANUFACTURING COMPANY, LTD., Hsinchu (TW)

(72) Inventors: Chin-Lung Chung, Hsinchu (TW); Shin-Yi Yang, Hsinchu (TW); Yu-Chen Chan, Hsinchu (TW); Han-Tang Hung, Hsinchu (TW); Shu-Wei Li, Hsinchu (TW); Ming-Han Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 803 days.

(21) Appl. No.: 17/900,151

(22) Filed: Aug. 31, 2022

(65) Prior Publication Data

US 2024/0071822 A1    Feb. 29, 2024

(51) Int. Cl.
H10W 20/00 (2026.01)
H10W 20/41 (2026.01)

(52) U.S. Cl.
CPC ....... H10W 20/037 (2026.01); H10W 20/056 (2026.01); H10W 20/076 (2026.01); H10W 20/425 (2026.01)

(58) Field of Classification Search
CPC ......... H01L 21/76849; H01L 21/76831; H01L 21/76883; H01L 23/53238; H01L 21/76805; H01L 21/76807; H01L 23/5226; H01L 2221/1063; H01L 21/76844; H10W 20/037; H10W 20/056; H10W 20/076; H10W 20/425; H10W 20/0372; H10W 20/0765; H10W 20/42; H10W 20/034; H10W 20/083; H10W 20/084
See application file for complete search history.

(56) References Cited

U.S. PATENT DOCUMENTS

| | | | | |
|---|---|---|---|---|
| 2008/0182406 A1* | 7/2008 | Preusse | ............. | H01L 21/76802 |
| | | | | 438/627 |
| 2009/0309226 A1* | 12/2009 | Horak | ............... | H01L 21/76849 |
| | | | | 257/761 |
| 2014/0284802 A1* | 9/2014 | Sakata | ............. | H01L 23/53257 |
| | | | | 257/750 |
| 2024/0038665 A1* | 2/2024 | Cheng | ............... | H01L 21/76885 |

* cited by examiner

*Primary Examiner* — Thanh T Nguyen
(74) *Attorney, Agent, or Firm* — Birch, Stewart, Kolasch & Birch, LLP

(57) ABSTRACT

A method for manufacturing a semiconductor structure includes forming a first interconnect feature in a first dielectric feature, the first interconnect feature including a first conductive element exposed from the first dielectric feature; forming a first cap feature over the first conductive element, the first cap feature including a first cap element which includes a two-dimensional material; forming a second dielectric feature with a first opening that exposes the first cap element; forming a barrier layer over the second dielectric feature while exposing the first cap element from the barrier layer; removing a portion of the first cap element exposed from the barrier layer; and forming a second conductive element in the first opening.

20 Claims, 21 Drawing Sheets

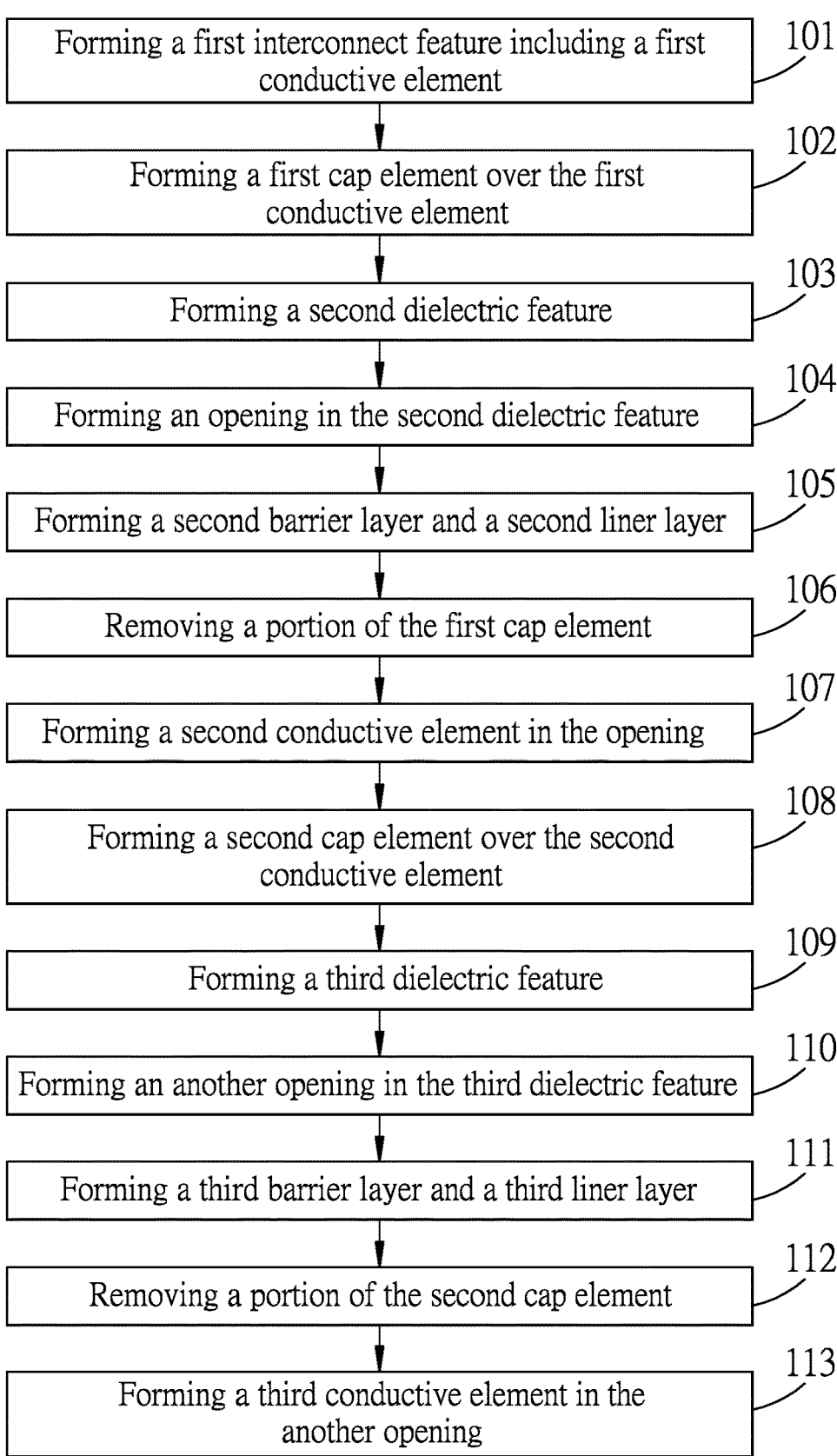

Forming a first interconnect feature including a first conductive element — 101

Forming a first cap element over the first conductive element — 102

Forming a second dielectric feature — 103

Forming an opening in the second dielectric feature — 104

Forming a second barrier layer and a second liner layer — 105

Removing a portion of the first cap element — 106

Forming a second conductive element in the opening — 107

Forming a second cap element over the second conductive element — 108

Forming a third dielectric feature — 109

Forming an another opening in the third dielectric feature — 110

Forming a third barrier layer and a third liner layer — 111

Removing a portion of the second cap element — 112

Forming a third conductive element in the another opening — 113

FIG. 1

LOW RESISTANCE INTERCONNECT FEATURES AND METHOD FOR MANUFACTURING THE SAME

BACKGROUND

With the shrinkage in dimension of semiconductor devices, contact area for via is found to be greatly reduced, resulting in a high contact resistance of interconnect structures. In addition, utilization of materials having high resistivity for manufacturing the interconnect structures also contributes to the high contact resistance. Therefore, there is a need to develop a method for minimizing contact resistance of the interconnect structures, so as to enhance performance of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor structure including low resistance interconnect features in accordance with some embodiments.

DETAILED DESCRIPTION

Figure 2:
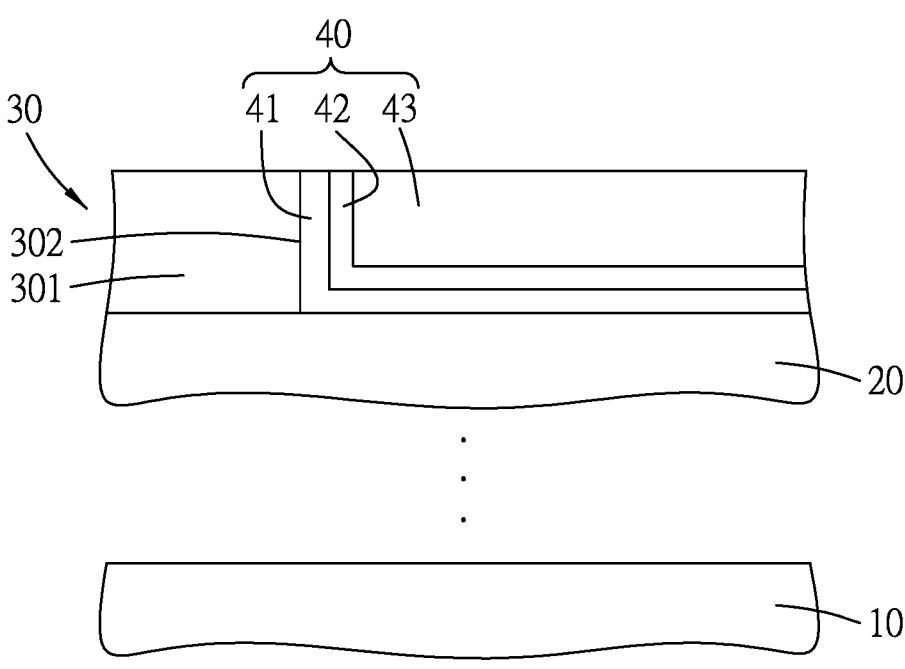
FIGS. 2 to 40 are schematic views illustrating intermediate stages of the method for manufacturing the semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor structure including low resistance interconnect features, and a method for manufacturing thereof. The interconnect features may be, for example, but not limited to, a via ($V_x$), and two metal lines ($M_x$, $M_{x+1}$) that are respectively connected to a bottom and a top of the via ($V_x$). In accordance with some embodiments, the interconnect features cooperatively provide a direct contact via, i.e., a contact resistance at interfaces between the via ($V_x$) and each of the two metal lines ($M_x$, $M_{x+1}$) is relatively low. For example, in some embodiments, a barrier layer is absent at the bottom of the via ($V_x$). In other embodiments, the barrier layer is absent at both the bottom and the top of the via ($V_x$).

The method described in the present disclosure may be a part of a back-end-of-line (BEOL) process flow. A maximum temperature limitation for the BEOL process is approximately 400° C. For example, in some cases, if a deposition or treatment in the BEOL process is performed at a temperature higher than about 400° C., a front-end-of-line (FEOL) portion formed in a front-end-of-line (FEOL) process may be undesirably damaged. Therefore, in order to meet the maximum temperature limitation for the BEOL process, in some embodiments, throughout the method for manufacturing the semiconductor structure, all the steps described are controlled at a temperature lower than about 400° C., such as ranging from about room temperature to about 400° C.

FIG. 1 is a flow diagram illustrating a method for manufacturing the semiconductor structure in accordance with some embodiments. FIGS. 2 to 40 illustrate schematic views of intermediate stages of the method. Some repeating structures are omitted in FIGS. 2 to 40 for the sake of brevity. Additional steps can be provided before, after or during the method, and some of the steps described herein may be replaced by other steps or be eliminated.

Referring to FIG. 1 and the example illustrated in FIG. 2, the method begins at step 101, where a first interconnect feature 40 is formed in a first dielectric feature 30 over a device feature 20 opposite to a substrate 10.

In some embodiments, the substrate 10 may be, for example, but not limited to, a silicon-on-insulator (SOI) substrate, a germanium-on-insulator (GOI) substrate, a bulk semiconductor substrate (e.g., a bulk silicon substrate) or the like. The substrate 10 may have multiple layers. The substrate 10 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 10 may be intrinsic or doped with a dopant or different dopants. Other suitable substrate material for forming the substrate 10 are within the contemplated scope of the present disclosure.

The device feature 20 may include the front-end-of-line (FEOL) portion formed on the substrate 10. The FEOL portion may include any suitable semiconductor devices, such as active devices (for example, transistors, or the like), passive devices (for example, capacitors, resistors, or the like), decoders, amplifiers, other suitable devices, and combinations thereof. The device feature 20 may further include a middle-end-of-line (MEOL) portion formed on the FEOL portion and including, for example, metal contacts to be electrically connected to electrodes of the elements in the FEOL portion (for example, but not limited to, gate, source, and drain electrodes of the transistors), interlayer dielectric (ILD) layers among the metal contacts, and or other suitable elements. Other suitable components of the device feature 20 are within the contemplated scope of the present disclosure.

The first dielectric feature 30 may include a first etch stop layer (not shown) and a first dielectric element 301 formed on the first etch stop layer. The first etch stop layer may include silicon oxide ($SiO_x$), silicon carbide ($SiC_x$), silicon oxycarbide ($SiC_xO_y$), silicon nitride ($SiN_x$), silicon carbide nitride ($SiC_xN_y$), silicon oxynitride ($SiO_xN_y$), aluminum oxynitride ($AlO_xN_y$), aluminum nitride ($AlN_x$) or aluminum oxide ($AlO_x$), and may be doped with hafnium (Hf), zirconium (Zr), or yttrium (Y). The first etch stop layer is formed using a physical vapor deposition (PVD) process, a chemical vapor deposition (CVD) process, or an atomic layer deposition (ALD) process. Other suitable materials and/or processes for forming the first etch stop layer are within the contemplated scope of the present disclosure.

In some embodiments, the first etch stop layer may be a single-layer structure. In other embodiments, the first etch stop layer may be a multi-layered structure including two types of sub-layers that are made of different materials and that are alternately stacked on one another to cooperative form the first etch stop layer. The first etch stop layer has a different etching rate relative to the overlying first dielectric element 301 and thus can be used to stop etching of the first dielectric element 301 during formation of a trench 302 described below.

The first dielectric element 301 may include a low dielectric constant (low-k) material. Examples of the low-k material include silicon carbon nitride ($SiC_xN_y$), boron carbon nitride ($BC_xN_y$), silicon oxide ($SiO_x$), silicon nitride ($SiN_x$), silicon carbide ($SiC_x$), silicon oxycarbide ($SiO_xC_y$), silicon oxynitride ($SiO_xN_y$), hydrogenated silicon oxycarbide ($SiO_xC_yH_z$), spin-on glass (SOG), amorphous fluorinated carbon, borophosphosilicate glass (BPSG), fluorinated silica glass (FSG), xerogel, aerogel, polyimide, parylene, bisbenzocyclobutenes, non-porous materials, porous materials, or combinations thereof. The first dielectric element 301 is formed on the first etch stop layer using a process such as PVD, CVD or ALD. Other suitable materials and/or processes for forming the first dielectric element 301 are within the contemplated scope of the present disclosure.

The first interconnect feature 40 includes a first barrier layer 41, a first liner layer 42 and a first conductive element 43 that are exposed from the first dielectric feature 30.

The first barrier layer 41 is formed to separate the first liner layer 42 and the first conductive element 43 from the first dielectric feature 30. The first barrier layer 41 is configured to resist migration of materials of the first conductive element 43 into the first dielectric feature 30. The first barrier layer 41 may include a metal nitride such as tantalum nitride ($TaN_x$), titanium nitride ($TiN_x$), tungsten nitride ($WN_x$); a metal oxide such as hafnium oxide ($HfO_x$); a metal such as, tantalum (Ta), zinc (Zn), manganese (Mn), zirconium (Zr), titanium (Ti), hafnium (Hf), niobium (Nb), vanadium (V), chromium (Cr), scandium (Sc), yttrium (Y), tungsten (W), molybdenum (Mo), aluminum (Al), ruthenium (Ru), cobalt (Co), or combinations thereof. Other suitable materials for forming the first barrier layer 41 are within the contemplated scope of the present disclosure. In some embodiments, the first barrier layer 41 is made of tantalum nitride.

The first liner layer 42 is formed between the first conductive element 43 and the first barrier layer 41. The first liner layer 42 is configured to improve adhesion between of the first conductive element 43 and the first barrier layer 41. The first liner layer 42 may include a metal such as cobalt (Co), ruthenium (Ru) or tantalum (Ta); an alloy such as CoRu; or the like. Other suitable materials for forming the first liner layer 42 are within the contemplated scope of the present disclosure. In some embodiments, the first liner layer 41 is made of cobalt.

The first conductive element 43 may serve as a metal liner ($M_x$). The first conductive element 43 may include a metallic material having a promising conductive properties, such as copper (Cu), silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like. Other suitable materials for forming the first conductive element 43 are within the contemplated scope of the present disclosure. In some embodiments, the first conductive element 43 is made of copper.

In some embodiments, the first interconnect feature 40 may be formed in the first dielectric element 301 by the following sub-steps: (i) forming a trench 302 in the first dielectric element 301, (ii) sequentially depositing a barrier material for forming the first barrier layer 41 and a liner material for forming the first liner layer 42 to cover the first dielectric element 301 and inner surfaces of the trench 302 using PVD, CVD or ALD, (iii) filling the trench 302 with a conductive material for forming the first conductive element 43 using PVD, CVD or ALD, and (iv) performing a planarization process, such as a chemical mechanical planarization process (CMP), to remove the barrier, liner, and conductive materials above an upper surface of the first dielectric element 301 and to expose the upper surface of the first dielectric element 301. In some embodiments, the trench 302 may be formed by (a) forming a photoresist (not shown) using, for example, spin coating to cover the first dielectric feature 30, (b) patterning the photoresist using a photomask or without a mask (e.g., ion-beam writing) to obtain a patterned photoresist, and (c) etching the first dielectric element 301 through the patterned photoresist using a wet etching process, a dry etching process, or a combination thereof. Other suitable processes for forming the first interconnect feature 40 are within the contemplated scope of the present disclosure.

Figure 3:
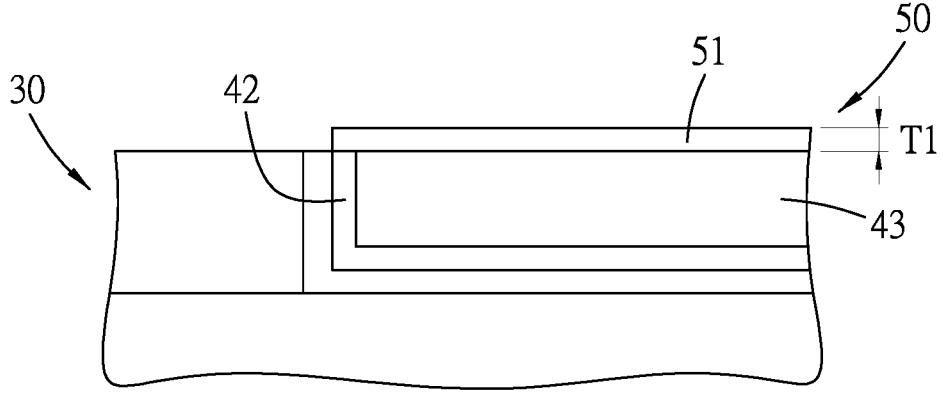

Referring to FIG. 1 and the example illustrated in FIG. 3, the method proceeds to step 102, where a first cap feature 50 is selectively formed over the first conductive element 43. In some embodiments, the first cap feature 50 includes a first cap element 51 which includes a two-dimensional (2D) material which has a relatively low electrical resistance in a plane where atoms of the 2D material are interconnected. In some embodiment, the 2D material includes graphene. In some embodiments, the first cap feature 50 is selectively formed to cover the first liner layer 42 exposed from the first dielectric feature 30.

In some embodiments, graphene for making the first cap element 51 is formed by performing a selective deposition process, e.g., a plasma enhanced CVD (PECVD) process using hydrocarbon precursors such as methane or ethene. In other embodiments, the first cap element 51 is formed by performing a lamination process to transfer a prepared graphene layer onto the conductive element 43. Other suitable processes and/or conditions for forming the first cap element 51 are within the contemplated scope of the present disclosure.

The first cap element 51 serves as an improved interface for providing better adhesion between the first conductive element 43 and the other components in steps to be performed subsequently. In addition, the first cap element 51 made of graphene may allow the first conductive element 43 to have an increased resistance to electromigration, so that the semiconductor structure of the present disclosure may have an improved reliability. Furthermore, the first cap element 51 may serve as a blocking layer in step 105 to be performed subsequently, so as to inhibit formation of a second barrier layer 61 and a second liner layer 62 thereon. In some embodiments, the first cap element 51 may have a thickness (T1) ranging from about 10 Å to about 100 Å. When the thickness (T1) is less than about 10 Å, such first cap element 51 may not be thick enough to demonstrate the abovementioned advantageous features. When the thickness (T1) is greater than about 100 Å, such first cap element 51 may not be cost effective.

Figure 4:
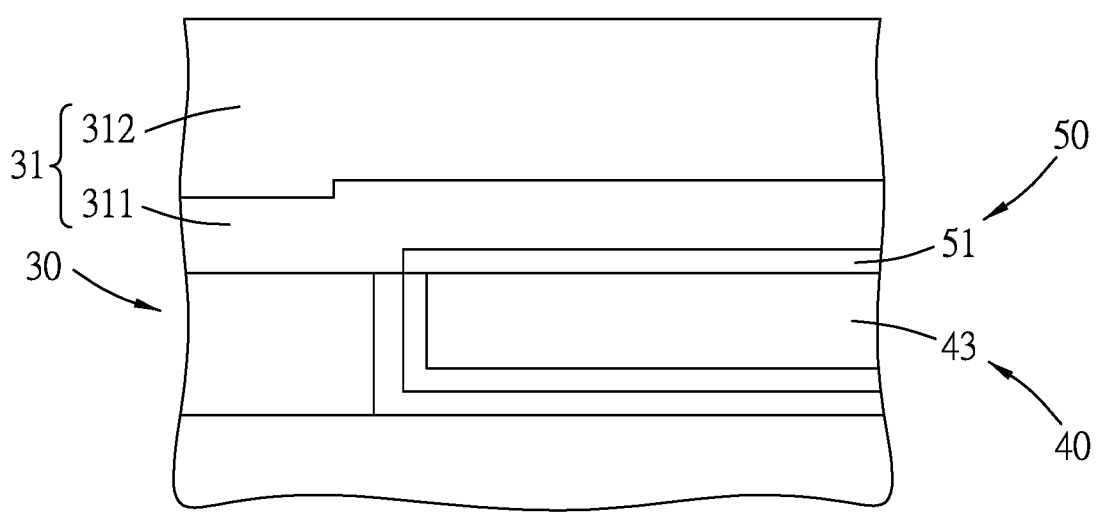

Referring to FIG. 1 and the example illustrated in FIG. 4, the method proceeds to step 103, where a second dielectric feature 31 is formed over the first interconnect feature 40, the first cap feature 50, and the first dielectric feature 30.

The second dielectric feature 31 includes a second etch stop layer 311 and a second dielectric layer 312, which are respectively formed in a manner similar to that for the first etch stop layer and the first dielectric layer 301 of the first dielectric feature 30, and thus, details thereof are omitted for the sake of brevity. In some embodiments, the second etch stop layer 311 is conformally formed on the first interconnect feature 40 and the first dielectric feature 30, and then a material for forming the second dielectric layer 312 is deposited on the second etch stop layer 311, followed by a planarization process, for example, CMP performed to permit the second dielectric layer 312 to have a flat upper surface.

Figure 5:
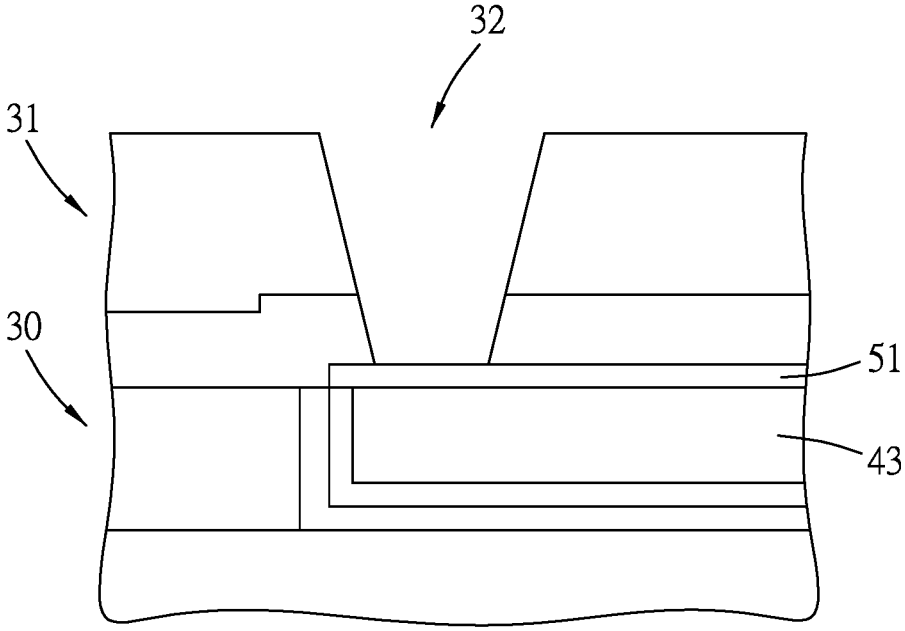

Referring to FIG. 1 and the example illustrated in FIG. 5, the method proceeds to step 104, where a first opening 32 is formed to extend through the second dielectric feature 31, so that the first cap element 51 is exposed from the second dielectric feature 31 through the first opening 32. The first opening 32 may be formed by any suitable processes. In some embodiments, the first opening 32 may be formed in a manner similar to the trench 302 described above with reference to FIG. 2, and thus the details thereof are omitted for the sake of brevity. Other suitable processes and/or conditions for forming the first opening 32 are within the contemplated scope of the present disclosure.

Figure 6:
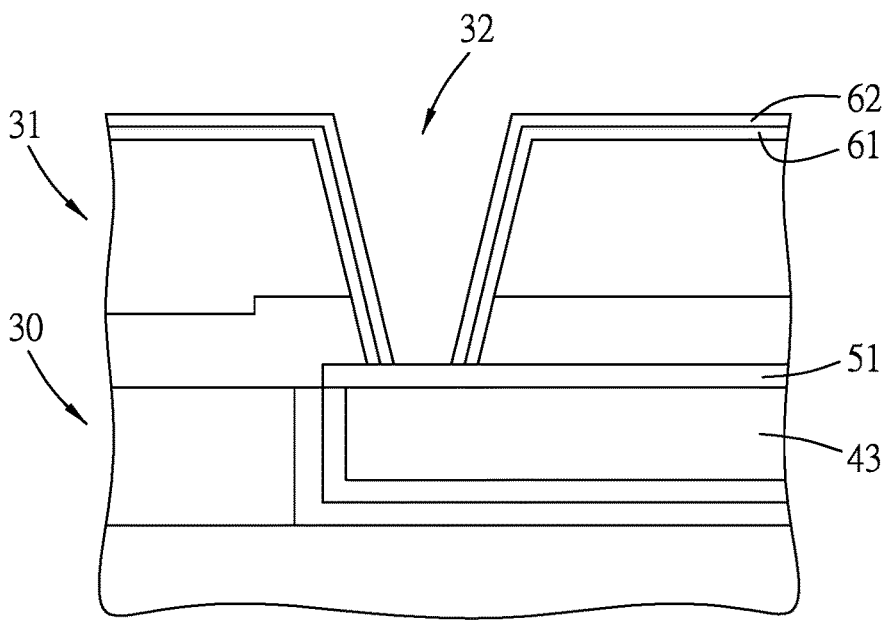

Referring to FIG. 1 and the example illustrated in FIG. 6, the method proceeds to step 105, where the second barrier layer 61 is formed over the second dielectric feature 31, and the second liner layer 62 is then formed on the second barrier layer 61 opposite to the second dielectric feature 31, while a portion of the first cap element 51 is exposed from the second liner layer 62.

The second barrier layer 61 may be made of a material similar to that of the first barrier layer 41, and the second liner layer 62 may be made of a material similar to that of the first liner layer 42, thus details thereof are omitted for the sake of brevity.

In some embodiments, each of the second barrier layer 61 and the second liner layer 62 is formed using a CVD process or an ALD process. The first cap element 51 made of graphene serves as the blocking layer, and formation of the second barrier layer 61 and the second liner layer 62 on the first cap element 51 are inhibited. As such, the second barrier layer 61 and the second liner layer 62 are formed in a selective manner on mainly the second dielectric feature 31 but not on the first cap element 51. Other suitable processes and/or conditions for such selective formation of the second barrier layer 61 and the second liner layer 62 are within the contemplated scope of the present disclosure.

Figure 7:
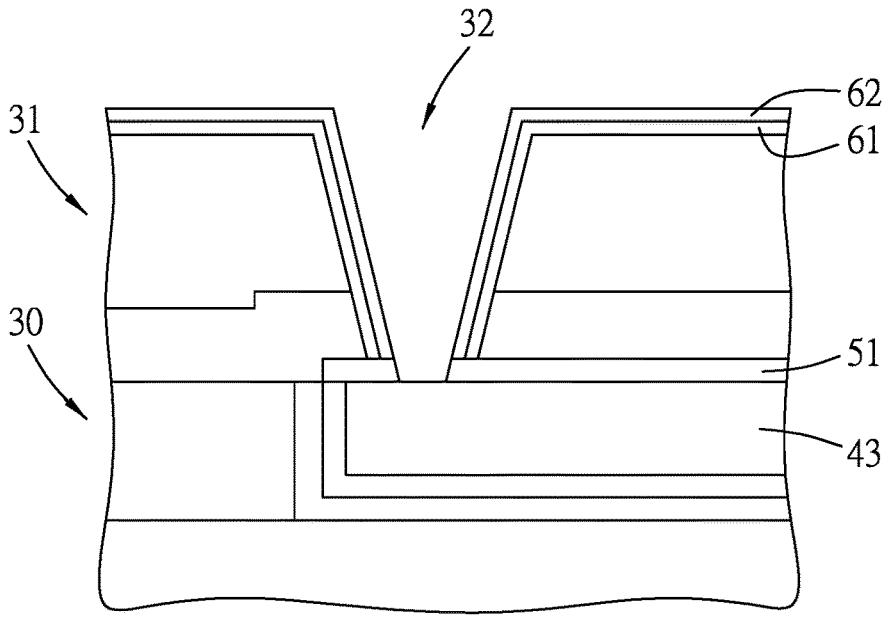

Referring to FIG. 1 and the example illustrated in FIG. 7, the method proceeds to step 106, where the portion of the first cap element 51 exposed from the second liner layer 62 is removed by any suitable processes using an etchant which has a higher etching selectivity to the material of the first cap element 51 than to that of the second liner layer 62. In some embodiments, the portion of the first cap element 51 is removed using a plasma etching process. The plasma etching process is beneficial to enhance purity, or quality of the second liner layer 62 by removing organometallic residue during formation thereof. After step 106, a portion of the first conductive element 43 is exposed from the remaining portion of the first cap element 51 through the first opening 32.

Figures 8, 9:
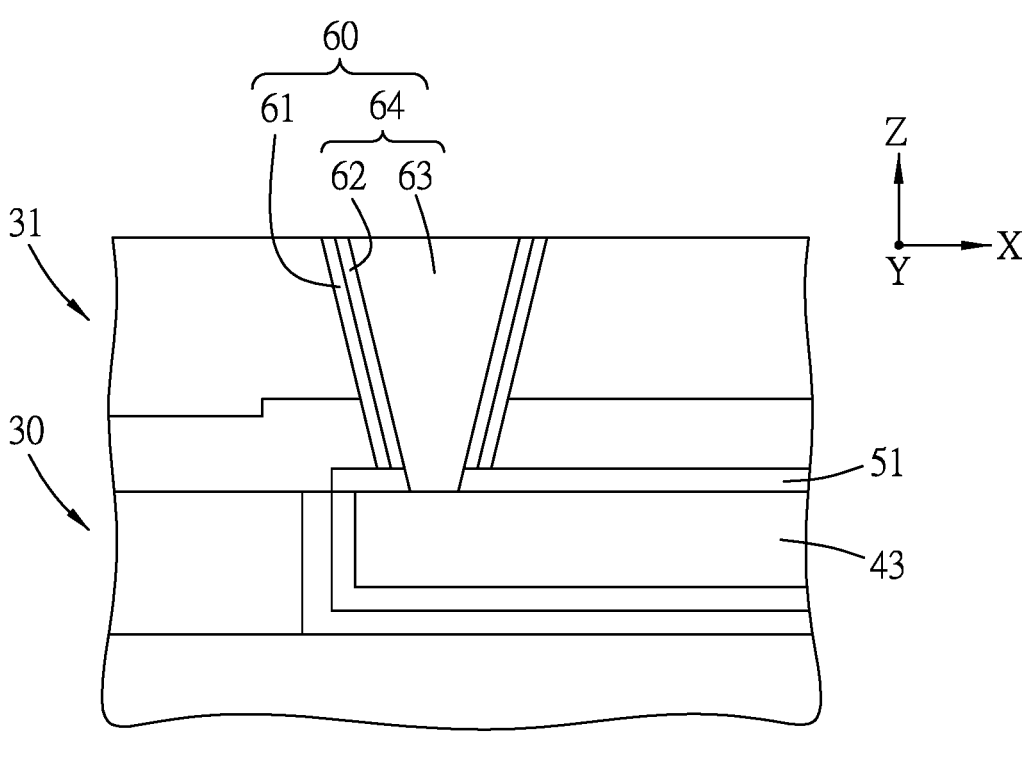

Referring to FIG. 1 and the example illustrated in FIG. 8, the method proceeds to step 107, where a second conductive element 63 is formed in the first opening 32 shown in FIG. 7. The second conductive element 63 may serve as a via (Vs).

Step 107 may include the sub-steps of: (i) filling a conductive material for forming the second conductive element 63 into the first opening 32 using a deposition process, such as PVD, CVD, ALD, electroless deposition (ELD), electro-chemical plating (ECP), or other suitable techniques such that the conductive material is in direct contact with the first conductive element 43; and (ii) performing a planarization process, such as CMP, to remove an excess amount of the conductive material and to expose the second liner layer 62 so as to obtain the second conductive element 63 which is in direct contact with the first conductive element 43. The CMP process may continue to further remove an excess amount of each of the second liner layer 62 and the second barrier layer 61 so as to expose the upper surface of the second dielectric feature 31. After completing step 107, as shown in FIG. 8, a second interconnect feature 60 is formed in the second dielectric feature 31 to include the second barrier layer 61, the second conductive element 63, and the second liner layer 62 disposed between the second conductive element 63 and the second barrier layer 61.

In sub-step (i) of step 107, the conductive material for forming the second conductive element 63 may be similar to the conductive material of the first conductive element 43, and thus details thereof are omitted for the sake of brevity.

Referring to FIG. 8, the second dielectric feature 31 has the upper surface distal from the first dielectric feature 30, and a lower surface opposite to the upper surface. In some embodiments, the second conductive element 63 and the second liner layer 62 may serve as a conductive portion 64 of the second interconnect feature 60. The second barrier layer 61 extends from the upper surface of the second dielectric feature 31 to terminate at the lower surface of the second dielectric feature 31, such that the conductive portion 64 is separated from the second dielectric feature 31 through the second barrier layer 61. In addition, the conductive portion 64 extends through the second dielectric feature 31 and the first cap element 51. The first cap element 51 is configured to inhibit formation of the second barrier layer 61 thereon, and thus, the second barrier layer 61 is absent between the first conductive element 43 and the conductive portion 64, and is also absent between first cap element 51 and the conductive portion 64 (in this case, the second barrier layer 61 is absent between the first cap element 51 and the second conductive element 63). In some embodiments, formation of the second liner layer 62 on the first cap element 51 is inhibited by the first cap element 51, such that, the second liner layer 62 is also absent between the first conductive element 43 and the second conductive element 63, and is also absent between the first cap element 51 and the second conductive element 63, thereby allowing the second conductive element 63 to extend through the first cap element 51. Such configuration is conducive to provide a direct contact path between the first and second conductive elements 43, 63, so as to achieve low contact resistance therebetween. In comparison with other embodiments in which a barrier layer and a liner layer are present between two conductive elements, a contact resistance between the first and second conductive elements 43, 63 of the present disclosure may be reduced by 50% or more, depending on factors such as layout design. In short, in addition to the aforementioned advantages of the first cap element 51, the first cap element 51 made of graphene may also serve as the blocking layer that inhibits formation of the second barrier layer 61 thereon, so that the second barrier layer 61 and the second liner layer 62 would not be formed between the first and second conductive elements 43, 63, and thus, the advantageous effect provided thereby can be achieved.

It is noted that when a current is conducted along a Z direction (see FIG. 8) perpendicular to the plane where carbon atoms of the graphene are interconnected, a resistance along the Z direction is higher than that of along an X direction or a Y direction (i.e., within the plane where carbon atoms of the graphene are interconnected). As such, removal of the portion of the first cap element 51 in step 106 is conducive to provide the low resistance direct contact path between the first and second conductive elements 43, 63.

Alternatively, in other embodiments, the first cap feature 50 may further include a metallic element 52, which will be further described in the following paragraphs. FIGS. 9 to 14 respectively illustrate steps 102 to 107 similar to those described above with reference to FIGS. 2 to 8, except that the first cap feature 50 includes the metallic element 52 in addition to the first cap element 51.

Referring to FIG. 1 and the example illustrated in FIG. 9, in step 102, the first cap feature 50 is formed over the first conductive element 43. FIG. 9 is similar to FIG. 3, but illustrates that the first cap feature 50 obtained in step 102 includes both the first cap element 51 and the metallic element 52 in accordance with some embodiments. The material of the first cap element 51 is similar to that described with reference to FIG. 3. The metallic element 52 may include one of copper, cobalt, ruthenium, aluminum copper, cobalt tungsten, ruthenium cobalt, and combinations thereof. In certain embodiments, the metallic element 52 includes a material different from that of the first conductive element 43, e.g., the first conductive element 43 includes copper and the metallic element 52 includes cobalt. The metallic element 52 is first selectively formed over the first conductive element 43, followed by forming the first cap element 51 on the metallic element 52 in a similar manner as described in step 102 with reference to FIG. 3. In some embodiments, the metallic element 52 is also selectively formed on the first liner layer 42 exposed from the dielectric feature 30. The metallic element 52 may be selectively formed using any suitable processes, such as CVD or ALD. Other suitable materials and/or processes and/or conditions for forming the metallic element 52 are within the contemplated scope of the present disclosure. The metallic element 52 may have a thickness (T2) ranging from about 10 Å to about 100 Å, so as to provide mechanical support to the first cap element 51 in a cost effective manner.

Figure 10:
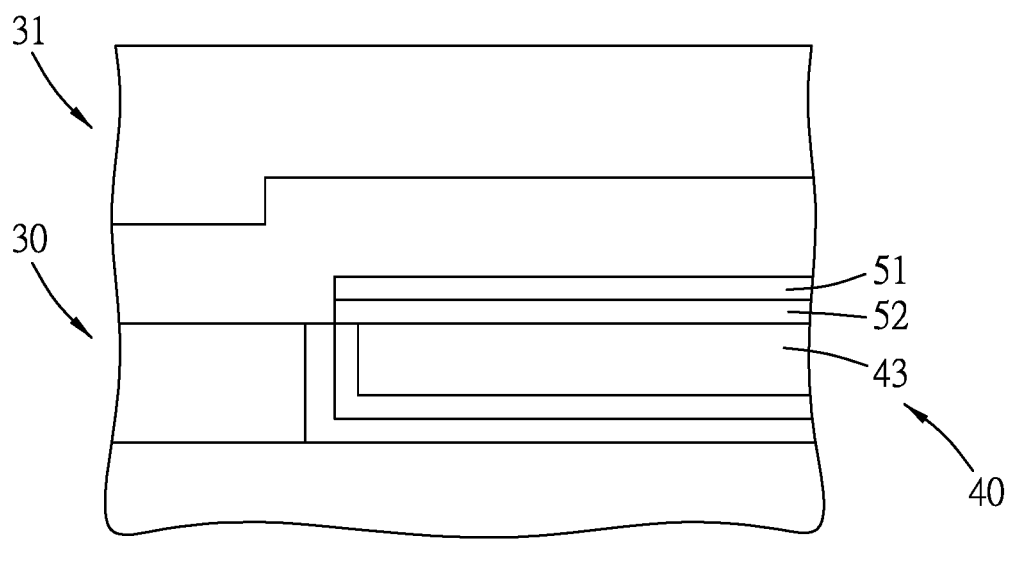
Figure 11:
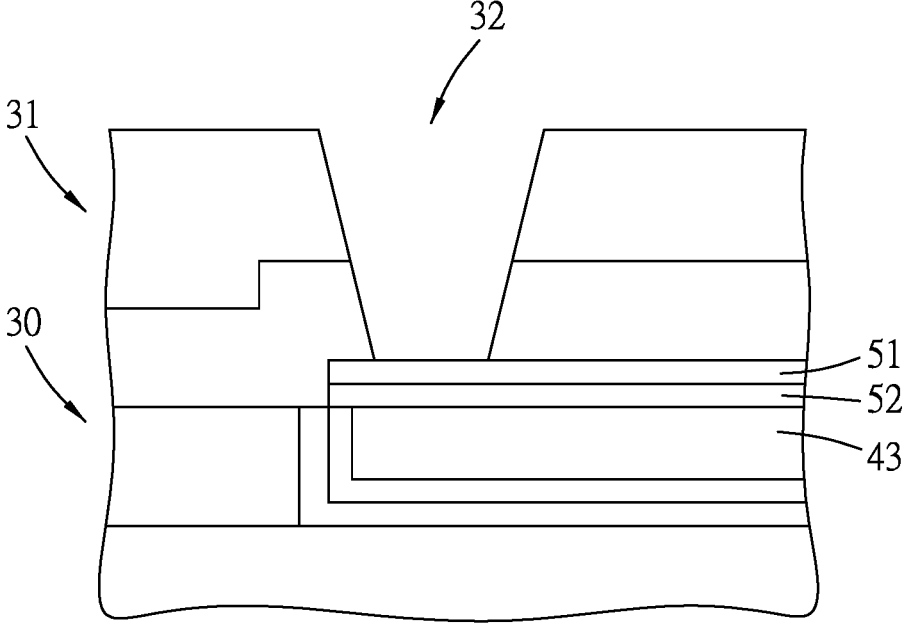
Figure 12:
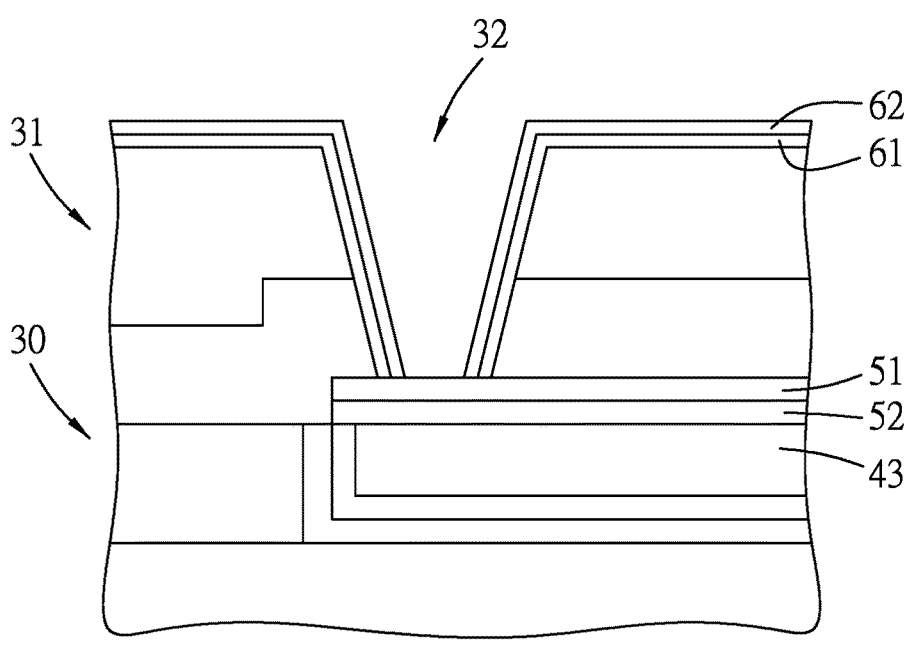

FIGS. 10 to 12 illustrate intermediate stages which are subsequent to that shown in FIG. 9 and which are respectively obtained in steps 103, 104, 105 in accordance with some embodiments. Since steps 103, 104, 105 with reference to FIGS. 10, 11, and 12 are performed in a manner similar to those described with reference to FIGS. 4, 5, and 6, details thereof are not repeated for the sake of brevity.

Figure 13:
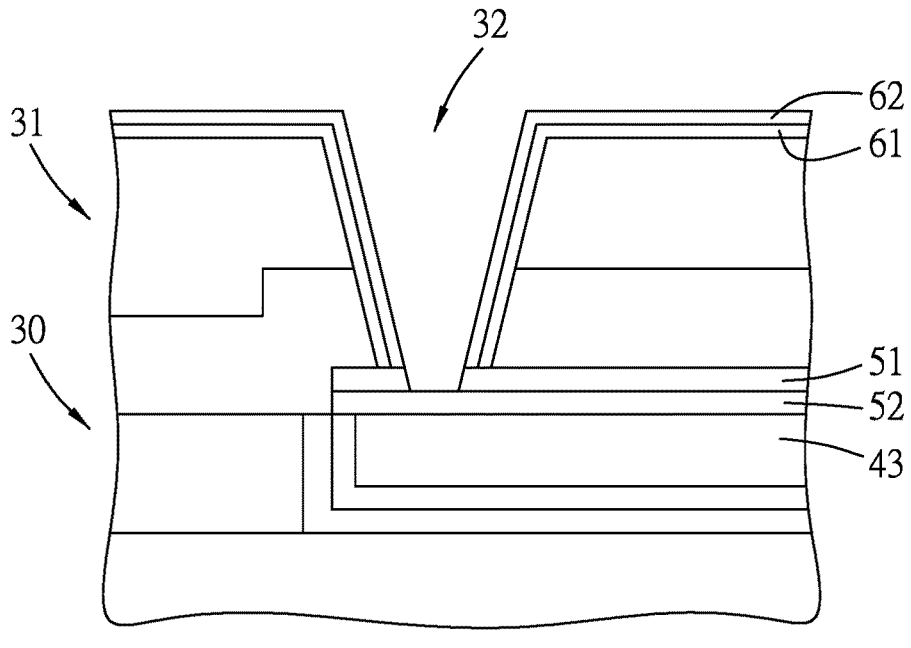

Referring to FIG. 1 and the example illustrated in FIG. 13, in step 106, the portion of the first cap element 51 exposed from the second liner layer 62 is removed. FIG. 13 is similar to FIG. 7, but illustrates that after removing the portion of the first cap element 51, a portion of the metallic element 52 is exposed from the remaining portion of the first cap element 51 through the first opening 32. Since the removal of the portion of the first cap element 51 illustrated in FIG. 13 is performed in a similar manner as described in step 106 with reference to FIG. 7, details thereof are not repeated for the sake of brevity.

Figure 14:
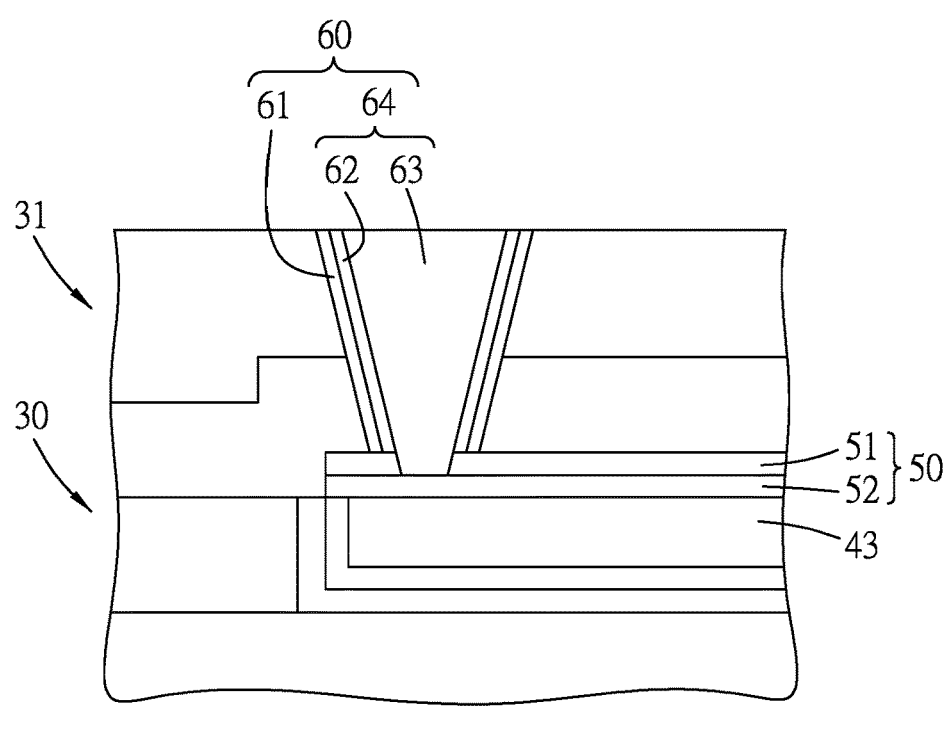

Referring to FIG. 1 and the example illustrated in FIG. 14, in step 107, the second conductive element 63 is formed in the first opening 32 shown in FIG. 13. FIG. 14 is similar to FIG. 8 except that the second conductive element 63 is in direct contact with the metallic element 52 in accordance with some embodiments. Since formation of the second conductive element 63 illustrated in FIG. 14 is performed in a manner similar to those described with reference to FIG. 8, details thereof are not repeated for the sake of brevity.

Referring to FIG. 14, when the first cap feature 50 includes both the first cap element 51 and the metallic element 52, the second conductive element 63 of the conductive portion 64 extends through the second dielectric feature 31 and the first cap element 51 to be in direct contact with the metallic element 52. That is, the first conductive element 43 is electrically connected to the second conductive element 63 through the metallic element 52. Since the metallic element 52 is made of a material with low resistivity, contact resistance at an interface between the first and second conductive elements 43, 63 is kept at a relatively low level. For instance, in comparison with other embodiments in which a barrier layer is present between two conductive elements, a contact resistance between the first and second conductive elements 43, 63 (even with the presence of the metallic element 52 therebetween) can be reduced by about 30% to about 50%. In addition, the first cap feature 50 that further includes the metallic element 52 in addition to the first cap element 51, is found to be more robust, and thus less liable to fracture or damage.

The above paragraphs illustrates different circumstances in which the first cap feature 50 may either include, or is free of the metallic element 52. One may decide whether to include the metallic element 52 or not according to practical needs. FIGS. 15 to 20 described hereinafter illustrate remaining steps of the method subsequent to step 107, in which the first cap feature 50 is exemplified by not including the metallic element 52 (with reference to the structure shown in FIG. 8), though in some other embodiments, the metallic element 52 may also be included (with reference to the structure shown in FIG. 14).

Figure 15:
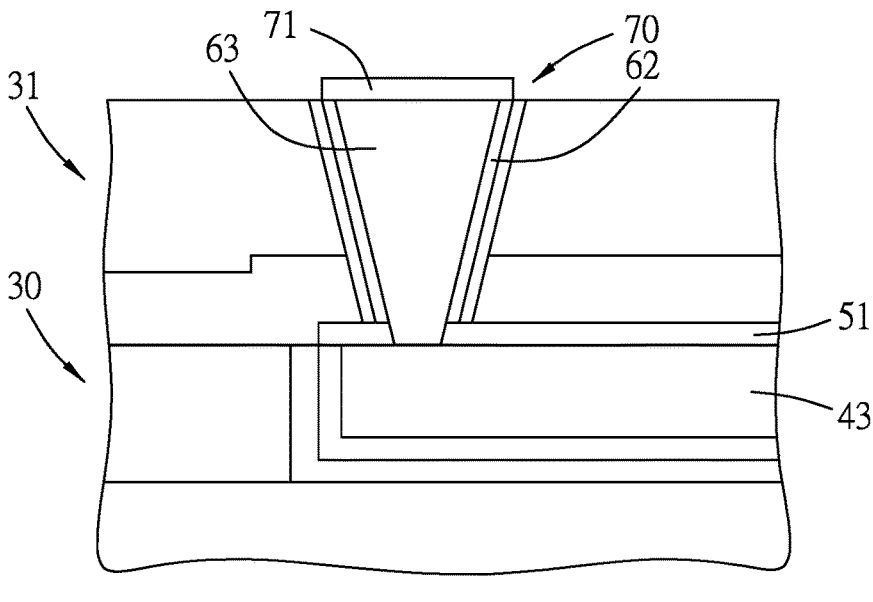

Referring to FIG. 1 and the example illustrated in FIG. 15, the method proceeds to step 108, where a second cap feature 70 is formed over the second conductive element 63. The second cap feature 70 includes a second cap element 71. The process and the material for forming the second cap element 71 are similar to those of the first cap element 51, and thus details thereof are omitted for the sake of brevity. In some embodiments, the second cap feature 70 is selectively formed to cover the second liner layer 62 and the second conductive element 63 that are exposed from the second dielectric feature 31.

Figure 16:
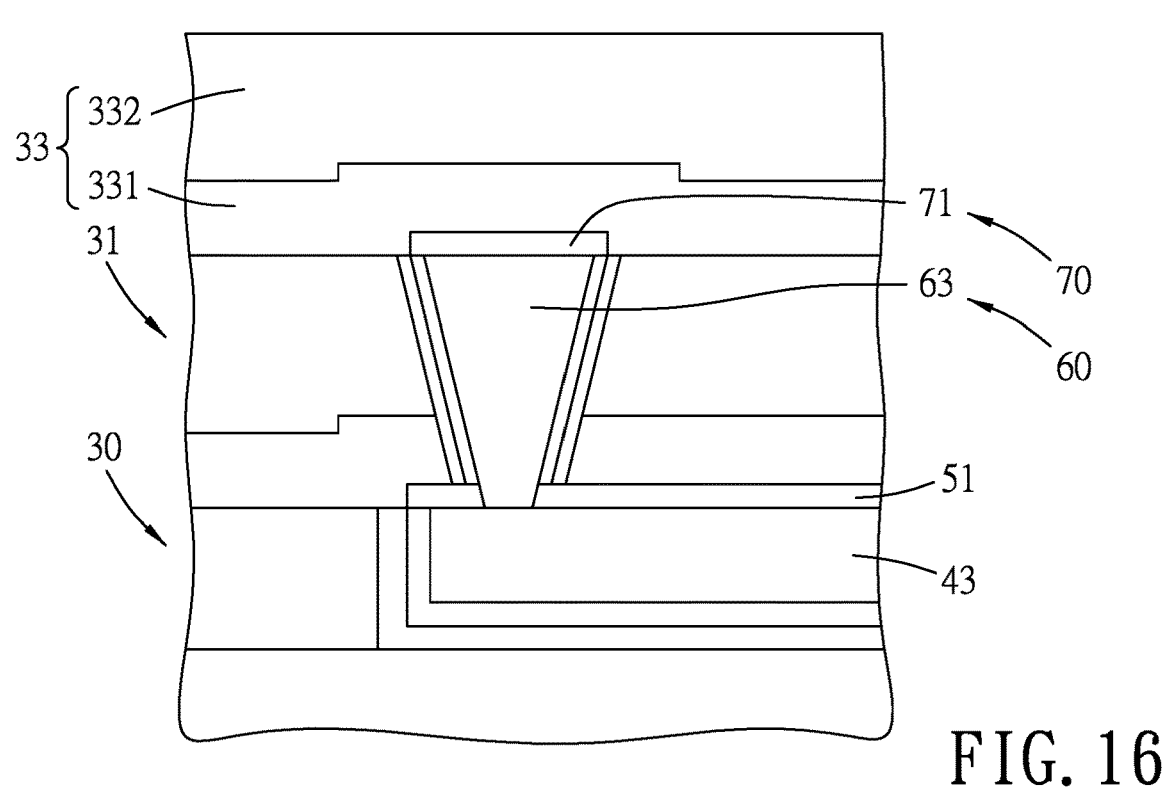

Referring to FIG. 1 and the example illustrated in FIG. 16, the method proceeds to step 109, where a third dielectric feature 33 is formed over the second interconnect feature 60, the second cap feature 70, and the second dielectric feature 31.

The third dielectric feature 33 includes a third etch stop layer 331 and a third dielectric layer 332. The third etch stop layer 331 is conformally formed on the second interconnect feature 60, the second cap feature 70, and the second dielectric feature 31. The third dielectric layer 332 is formed on the third etch stop layer 331. The processes and possible materials for forming the third etch stop layer 331 and the third dielectric layer 332 are respectively similar to those for the second etch stop layer 311 and the second dielectric layer 312 of the second dielectric feature 31 described with reference to FIG. 4, and thus, details thereof are omitted for the sake of brevity.

Figure 17:
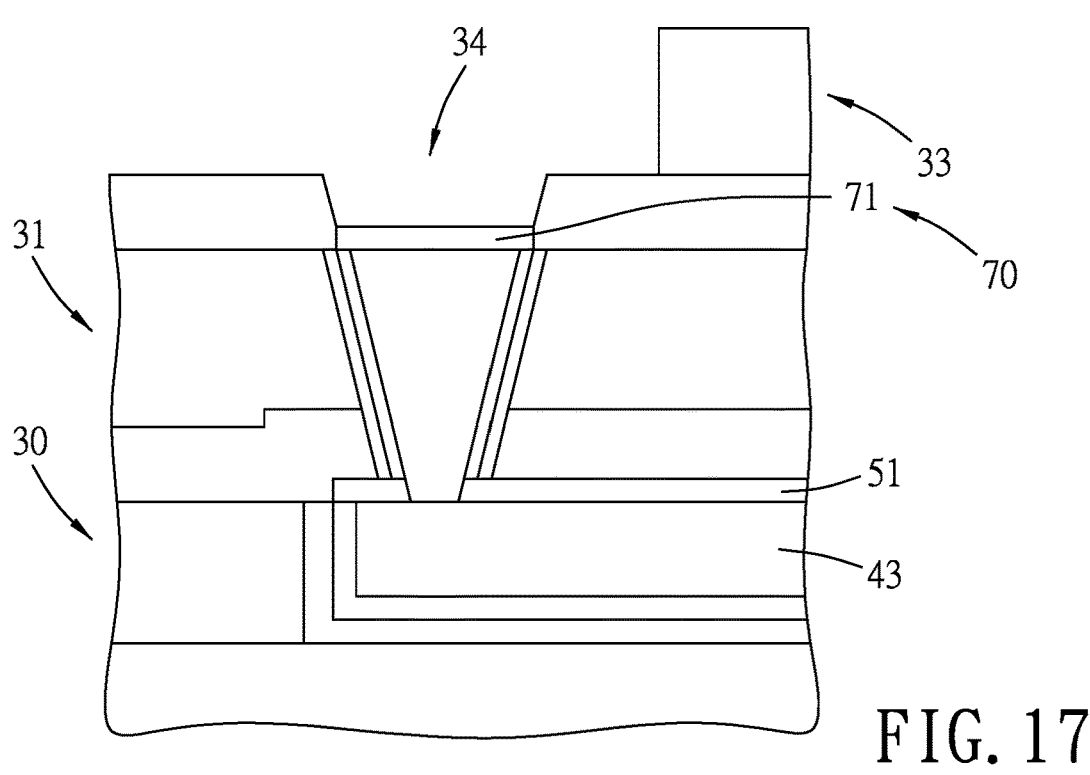

Referring to FIG. 1 and the example illustrated in FIG. 17, the method proceeds to step 110, where a second opening 34 is formed to extend through the third dielectric feature 33, so that the second cap element 71 is exposed from the third dielectric feature 33 through the second opening 34. The process for forming the second opening 34 is similar to that of the first opening 32, and thus the details thereof are omitted for the sake of brevity.

Figure 18:
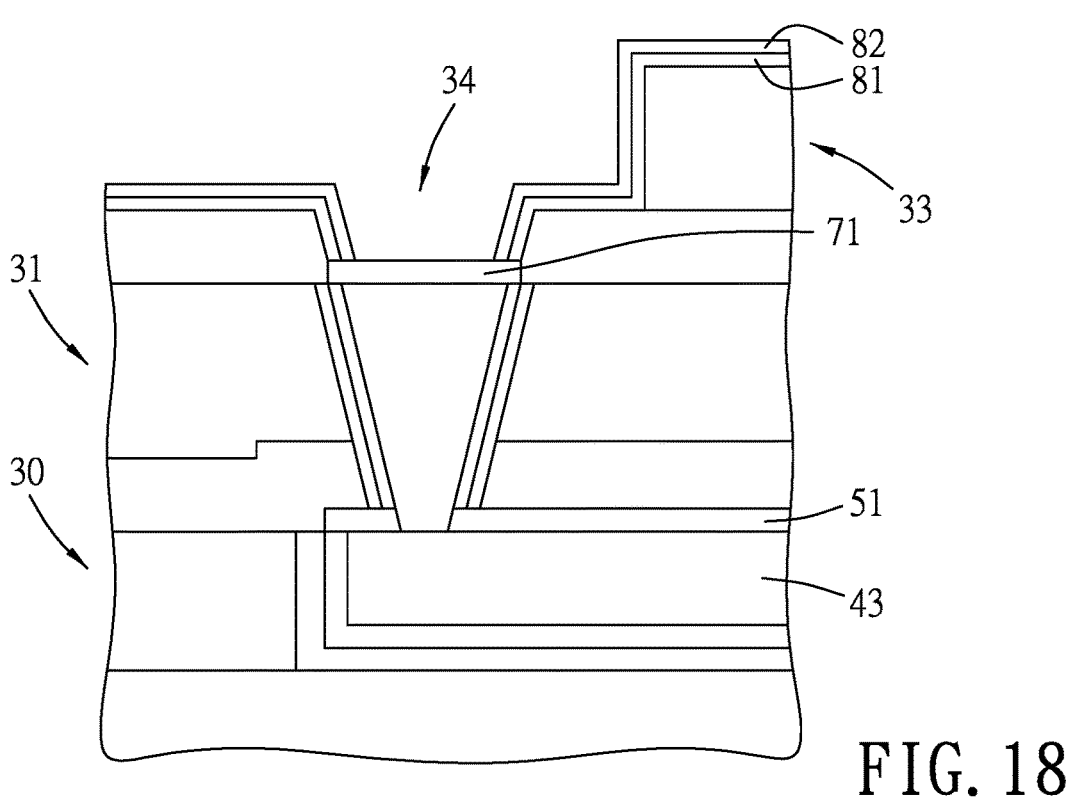

Referring to FIG. 1 and the example illustrated in FIG. 18, the method proceeds to step 111, where a third barrier layer 81 is formed over the third dielectric feature 33, and a third liner layer 82 is then formed on the third barrier layer 81 opposite to the third dielectric feature 33, while a portion of the second cap element 71 is exposed from the third liner layer 82. The processes and possible materials for the third barrier layer 81 are similar to those for the second barrier layer 61, and the processes and possible materials for the third liner layer 82 are similar to those for the second liner layer 62, thus details thereof are omitted for the sake of brevity.

Figure 19:
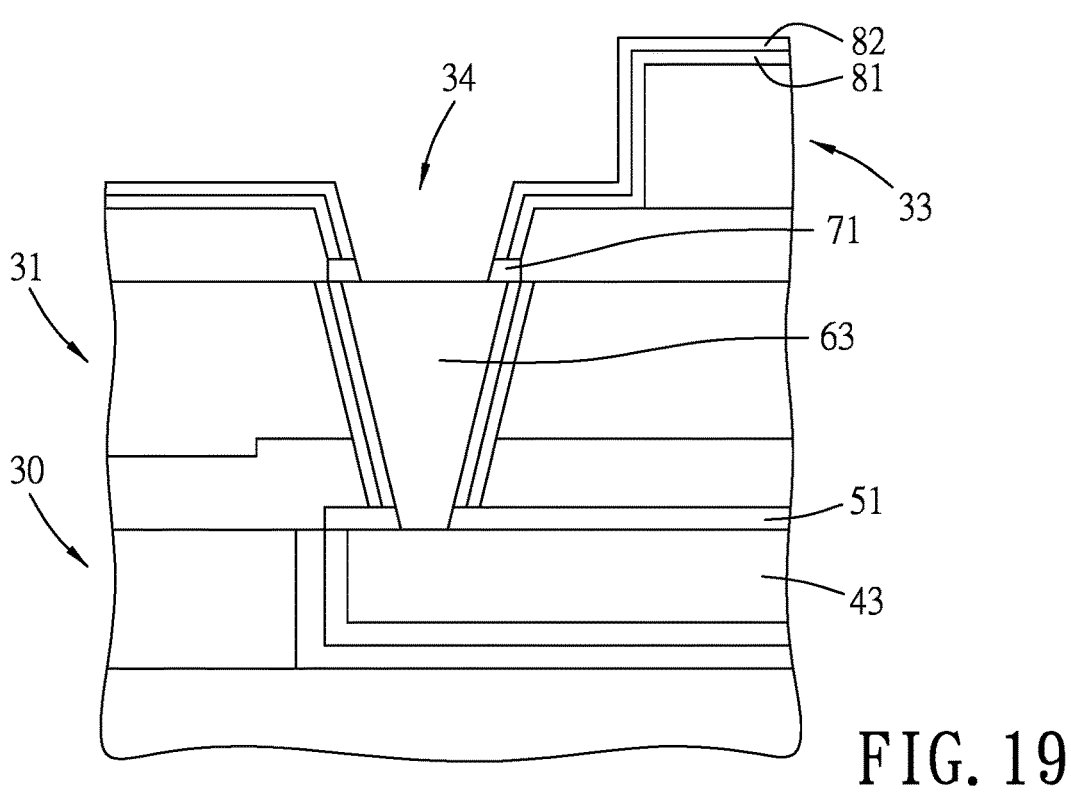

Referring to FIG. 1 and the example illustrated in FIG. 19, the method proceeds to step 112, where the portion of the second cap element 71 exposed from the third liner layer 82 is removed by any suitable processes using an etchant which has a higher etching selectivity to the material of the second cap element 71 than to that of the third liner layer 82. In some embodiments, the portion of the second cap element 71 is removed using a plasma etching process, for example, hydrogen ($H_2$) plasma or other suitable process. After step 112, a portion of the second conductive element 63 is exposed from the remaining portion of the second cap element 71 through the second opening 34.

Figure 20:
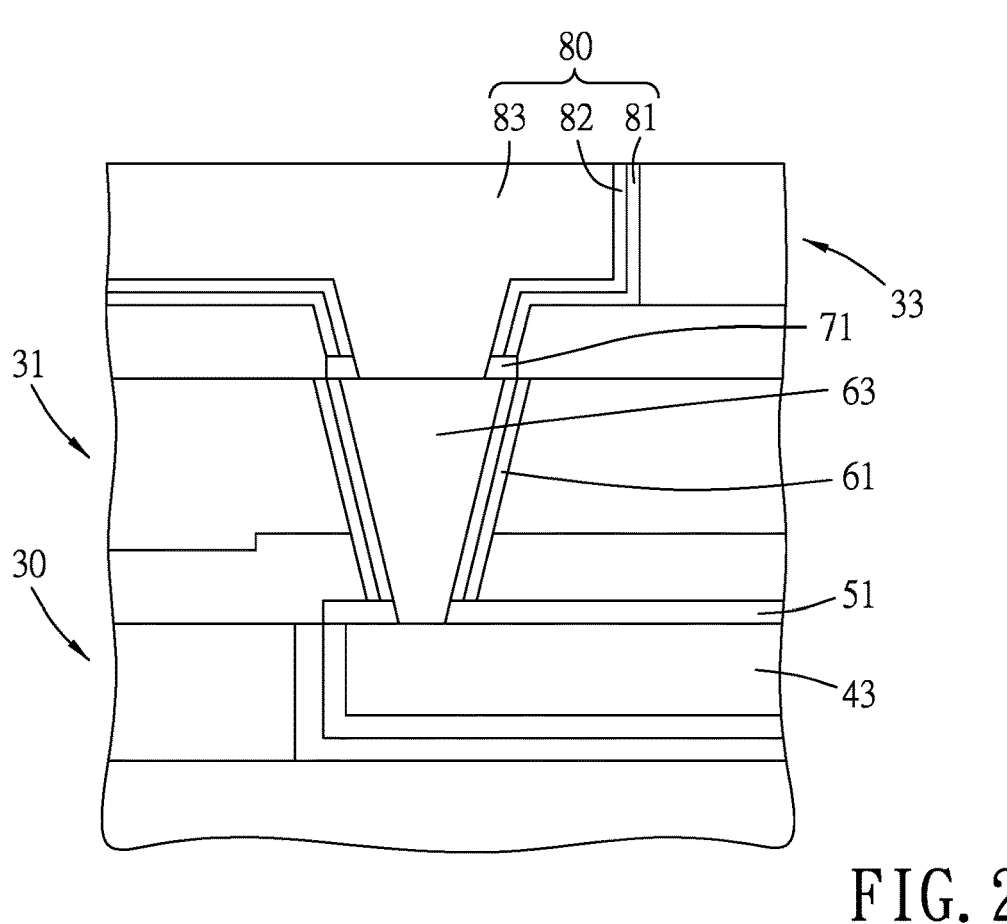

Referring to FIG. 1 and the example illustrated in FIG. 20, the method proceeds to step 113, where a third conductive element 83 is formed in the second opening 34 shown in FIG. 19, so that the third conductive element 83 is electrically connected to the second conductive element 63. The third conductive element 83 may serve as an another metal line ($M_{x+1}$). The processes and possible materials for the third conductive element 83 are similar to those of the second conductive element 62 described in step 107 with reference to FIG. 8. After completing step 113, as shown in FIG. 20, a third interconnect feature 80 is formed in the third dielectric feature 33 to include the third barrier layer 81, the third liner layer 82, and the third conductive element 83. The semiconductor structure of the present disclosure is thus obtained.

Referring to FIG. 20, with the configuration of the second cap element 71 which inhibits formation of the third barrier layer 81 thereon, the third barrier layer 81 is absent between the second conductive element 63 and the third conductive element 83 and is also absent between the third conductive element 83 and the second cap element 71. In some embodiments, formation of the third liner layer 82 on the second cap element 71 is inhibited by the second cap element 71, and thus the third liner layer 82 is absent between the second conductive element 63 and the third conductive element 83, and is also absent between the third conductive element 83 and the second cap element 71, thereby allowing the third conductive element 83 to extend through the second cap element 71. Such configuration provides a direct contact path between the second and third conductive elements 63, 83, so as to achieve low contact resistance therebetween.

For the structure exemplarily shown in FIG. 20, the second barrier layer 61 is absent at bottom of the via ($V_x$), i.e., the second conductive element 63), and the third barrier layer 81 is absent at the top of the via ($V_x$). The another metal line ($M_{x+1}$, i.e., the third conductive element 83), the via ($V_x$) and the metal line ($M_{x+1}$, i.e., the first conductive element 43) cooperate to form the direct contact via with low contact resistance at interfaces therebetween.

In some other embodiments, based on the layout design, the second cap element 71, or any other suitable blocking layers, might not be formed over the second conductive element 63, and in such case, the third barrier layer 81 and the third liner layer 82 might be formed between the second conductive element 63 and the third conductive element 83.

In yet other embodiments, the second cap feature 70 may further include an another metallic element 72 similar to the metallic element 52, and details thereof are omitted for the sake of brevity. FIGS. 21 to 26 respectively illustrate steps 108 to 113 similar to those described above with reference to FIGS. 15 to 20, except that the second cap feature 70 includes the another metallic element 72 in addition to the second cap element 71, and thus in the following paragraphs, details that remain the same are omitted for the sake of brevity.

Figure 21:
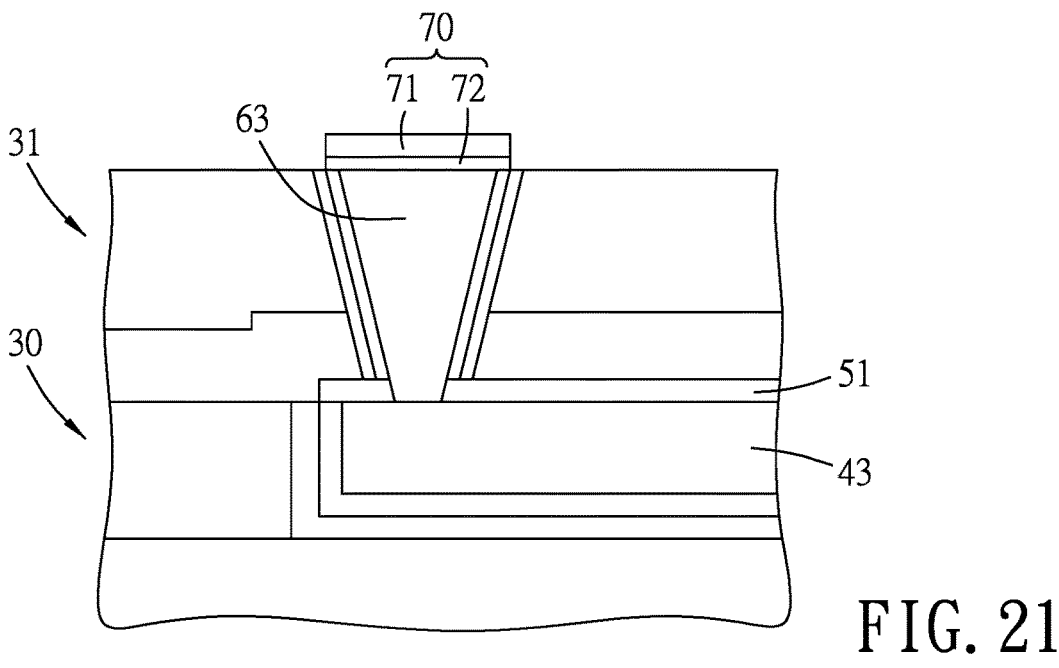

Referring to FIG. 1 and the example illustrated in FIG. 21, in step 108, the second cap feature 70 is formed over the second conductive element 63. FIG. 21 is similar to FIG. 15, but illustrates that the second cap feature 50 obtained in step 108 includes both the second cap element 71 and the another metallic element 72 in accordance with some embodiments. In this case, the another metallic element 72 is first selectively formed over the second conductive element 63, followed by forming the second cap element 71 on the another metallic element 72. The second cap element 71 and the another metallic element 72 of the second cap feature 70 are respectively formed in a manner similar to that for the first cap element 51 and the metallic element 51 of the first cap feature 50 described with reference to FIG. 9, thus, materials and processes for formation of the second cap element 71 and the another metallic element 72 are omitted for the sake of brevity.

Figure 22:
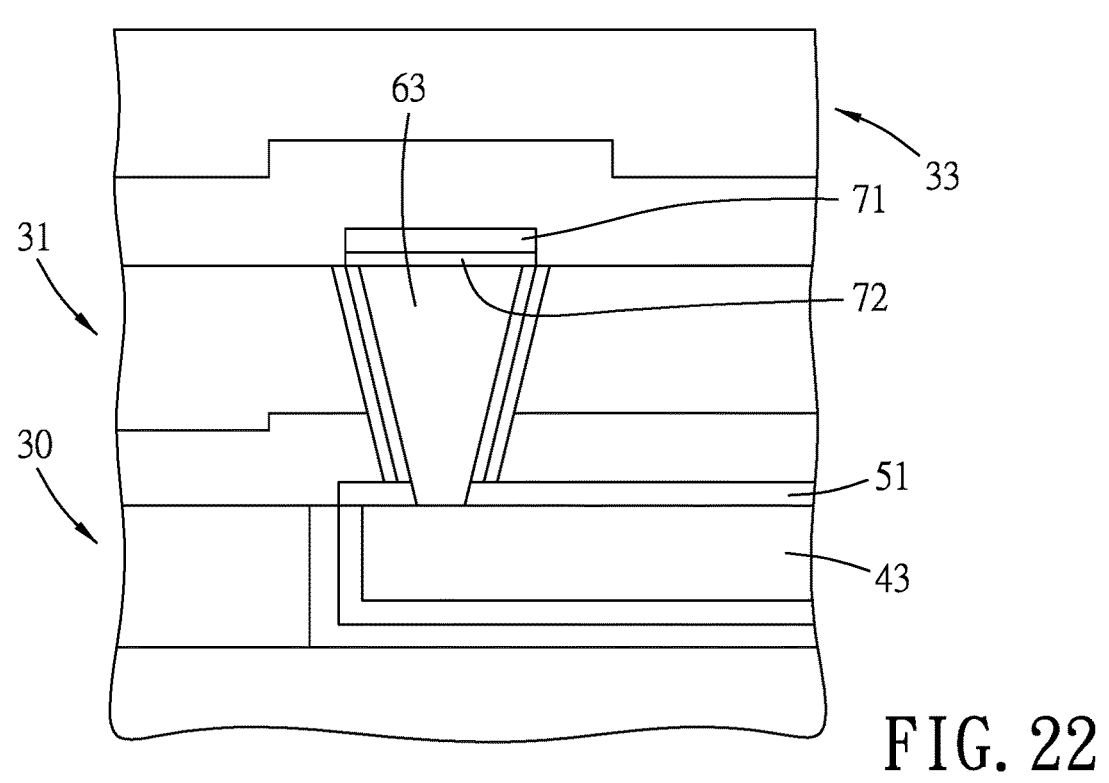
Figure 23:
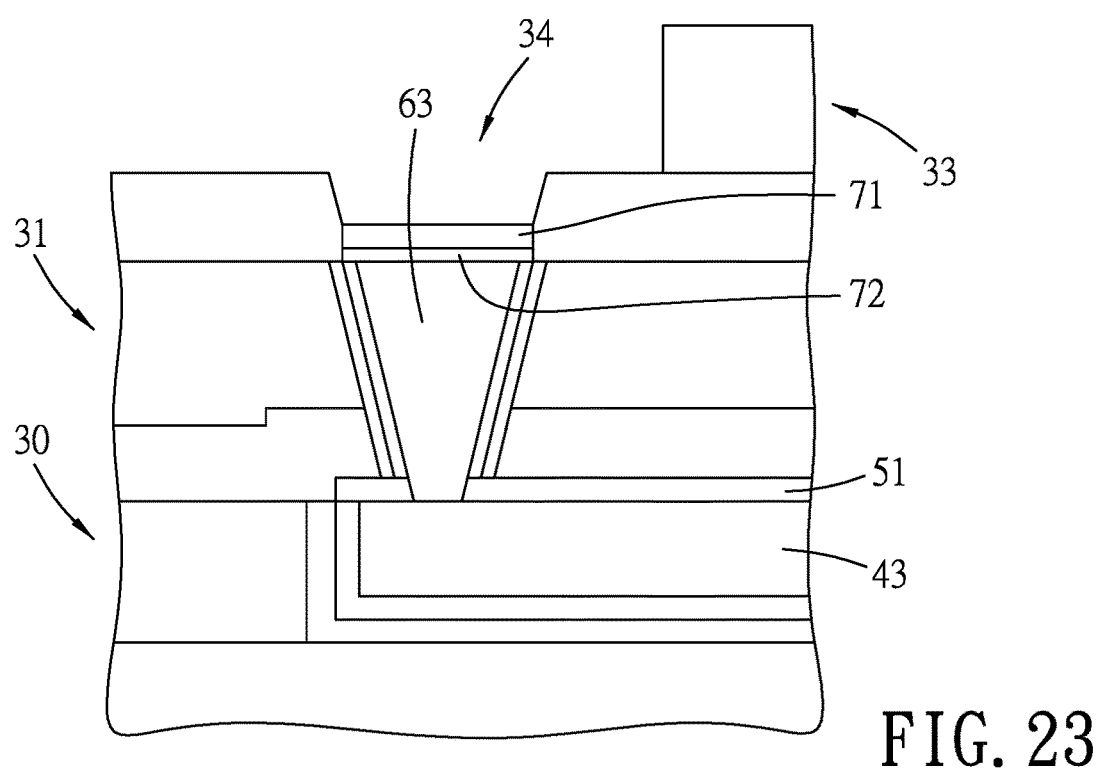
Figure 24:
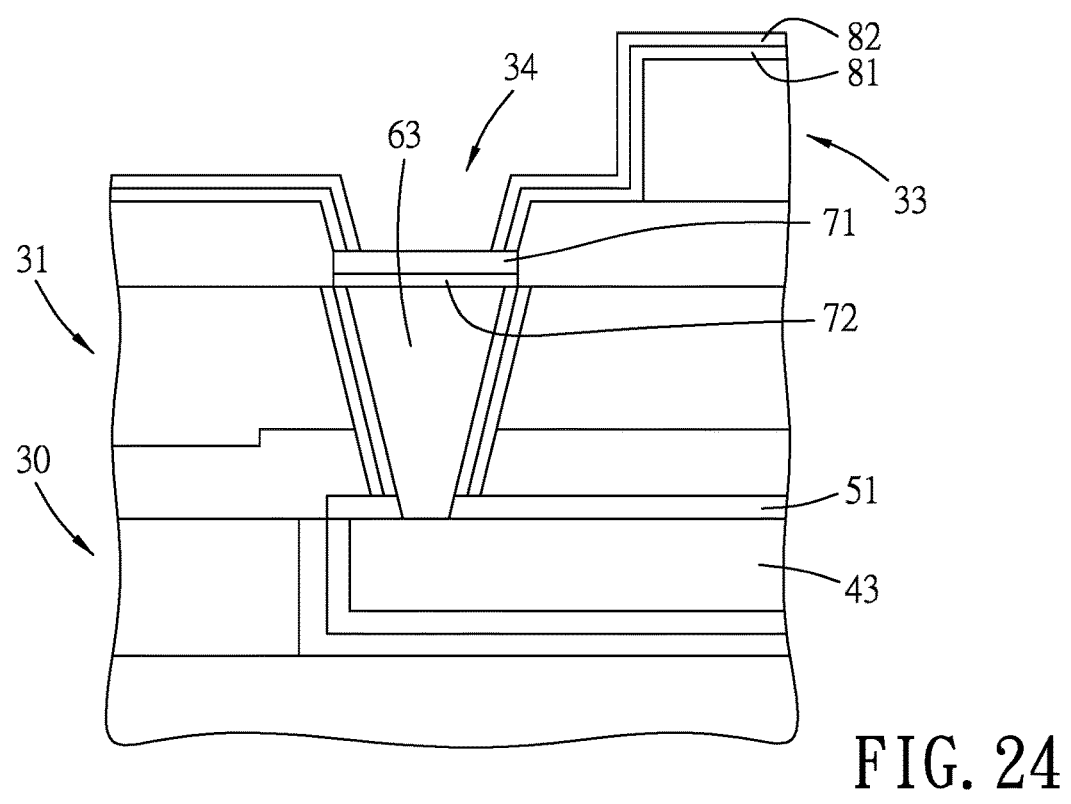

FIGS. 22 to 24 illustrates intermediate stages which are subsequent to that shown in FIG. 21 and which are respectively obtained in steps 109 to 111 in accordance with some embodiments. Since steps 109 to 111 with reference to FIGS. 22 to 24 are performed in a manner similar to those described with reference to FIGS. 16 to 18, details thereof are not repeated for the sake of brevity.

Figure 25:
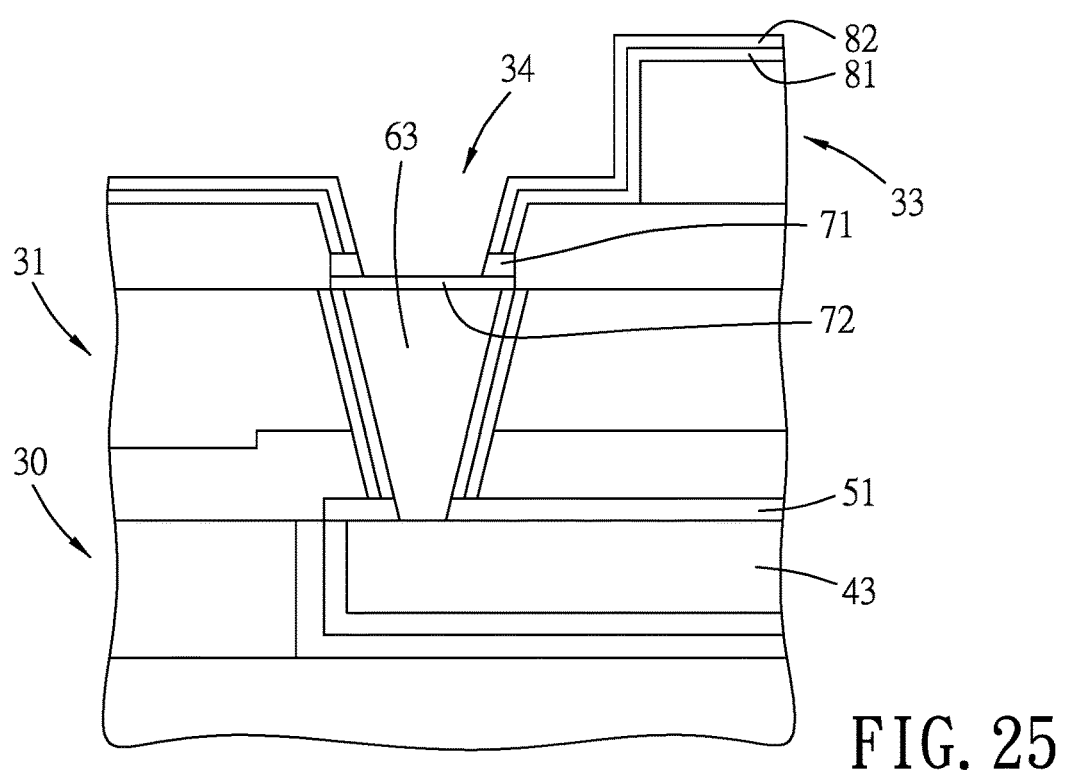

Referring to FIG. 1 and the example illustrated in FIG. 25, in step 112, the portion of the second cap element 71 exposed from the third liner layer 82 is removed. FIG. 25 is similar to FIG. 19, but illustrates that after removing the portion of the second cap element 71, a portion of the another metallic element 72 is exposed from the third liner layer 82. Since the removal of the portion of the second cap element 71 illustrated in FIG. 25 is performed in a similar manner as described in step 112 with reference to FIG. 19, details thereof are not repeated for the sake of brevity.

Figure 26:
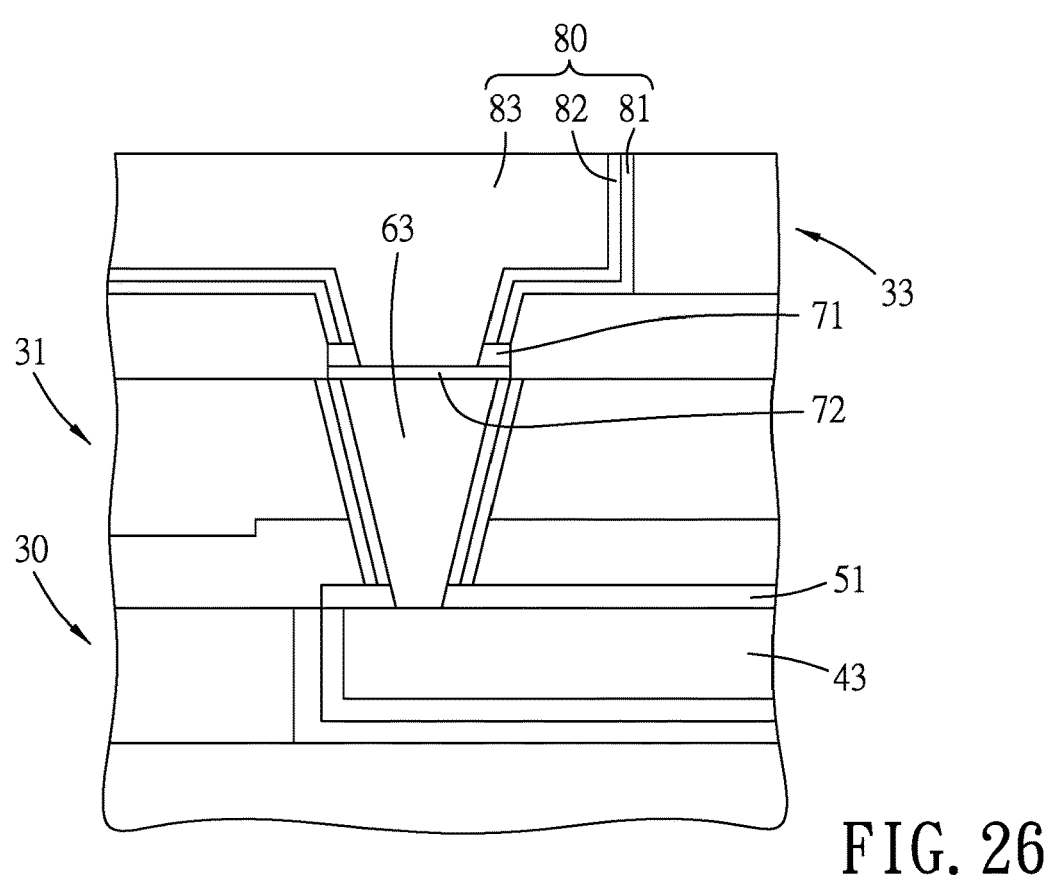

Referring to FIG. 1 and the example illustrated in FIG. 26, in step 113, the third conductive element 83 is formed in the second opening 34 shown in FIG. 25. FIG. 26 is similar to FIG. 20 except that the third conductive element 83 is in direct contact with the another metallic element 72 in accordance with some embodiments. Since formation of the third conductive element 63 illustrated in FIG. 26 is performed in a manner similar to those described in step 113 with reference to FIG. 20, details thereof are not repeated for the sake of brevity.

Description with reference to FIGS. 4 to 26 illustrates utilization of the first cap element 51 in two single damascene processes to form the second and third interconnect features 60, 80 with low contact resistance therebetween. In other embodiments, according to layout design and practical needs, the first cap element 51 may also be applied in one dual damascene process to form the second and third interconnect features 60, 80 with low contact resistance therebetween, and intermediate stages thereof which are subsequent to the structure shown in FIG. 3 are illustrated in FIGS. 27 to 31.

Figure 27:
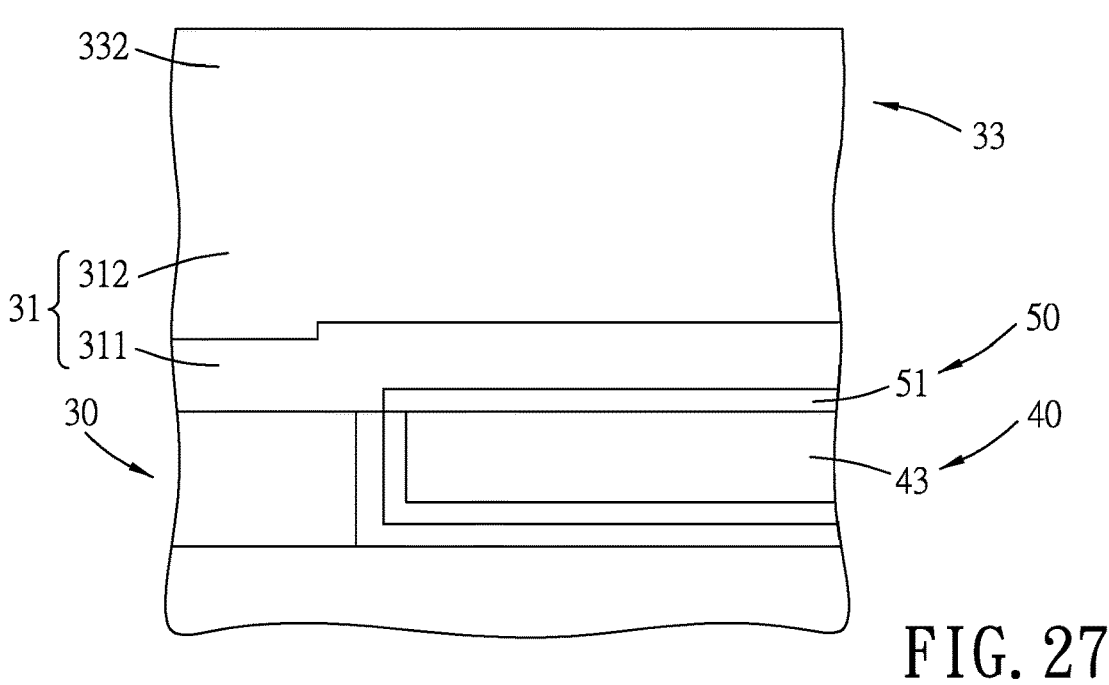

Referring to FIG. 27, the second dielectric feature 31 is formed over the first interconnect feature 40, the first cap feature 50, and the first dielectric feature 30, followed by forming the third dielectric feature 33 on the second dielectric feature 31 opposite to the first dielectric feature 30.

The second dielectric feature 31 includes the second etch stop layer 311 and the second dielectric layer 312 in accordance with some embodiment. The processes and the materials for forming the second etch stop layer 311 and the second dielectric layer 312 are similar to those obtained with reference to FIG. 4, and thus details thereof are omitted for the sake of brevity.

The third dielectric feature 33 includes the third dielectric layer 332 in accordance with some embodiment. The process and material for forming the third dielectric layer 332 is similar to those of the second dielectric layer 312, and details thereof are omitted for the sake of brevity.

Figure 28:
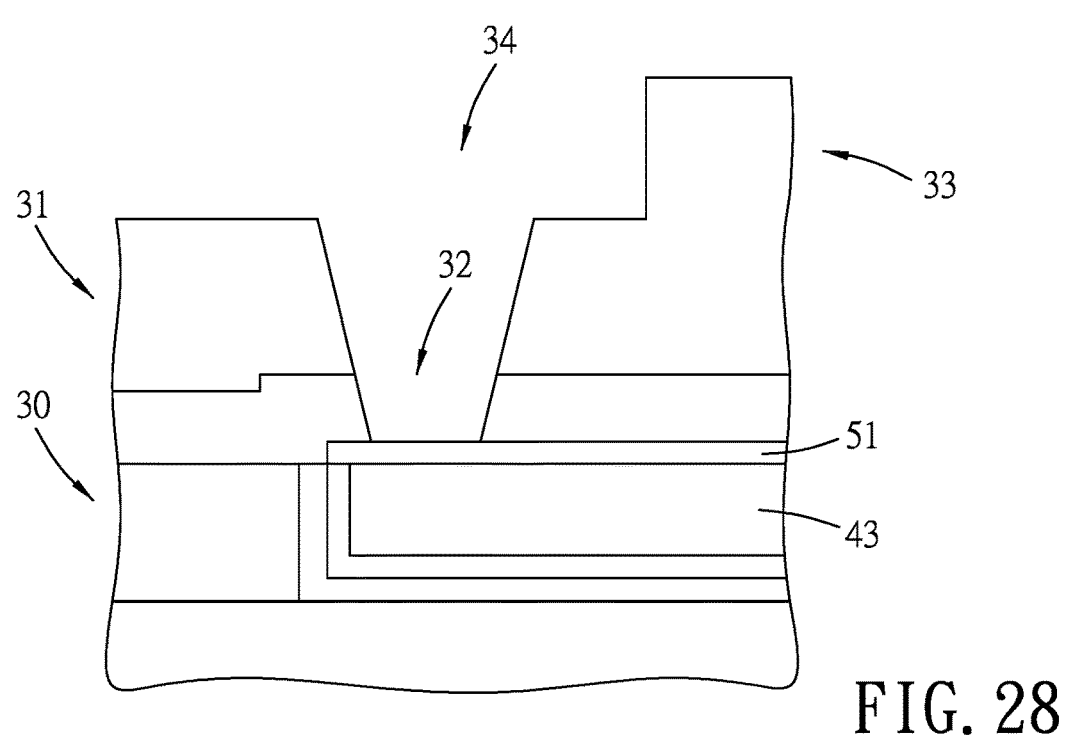

Referring to FIG. 28, the first opening 32 and the second opening 34 are formed by patterning the second dielectric feature 31 and the third dielectric feature 33 by one or more etching processes (for example, but not limited to, a dry etching process, a wet etching process, or a combination thereof) through one or more etching masks (not shown) so as to expose the first cap element 51 through the first and second openings 32, 34. The second opening 34 extends through the third dielectric feature 33, the first opening 32 extends through the second dielectric feature 31 to be spatial communication with the second opening 34.

Figure 29:
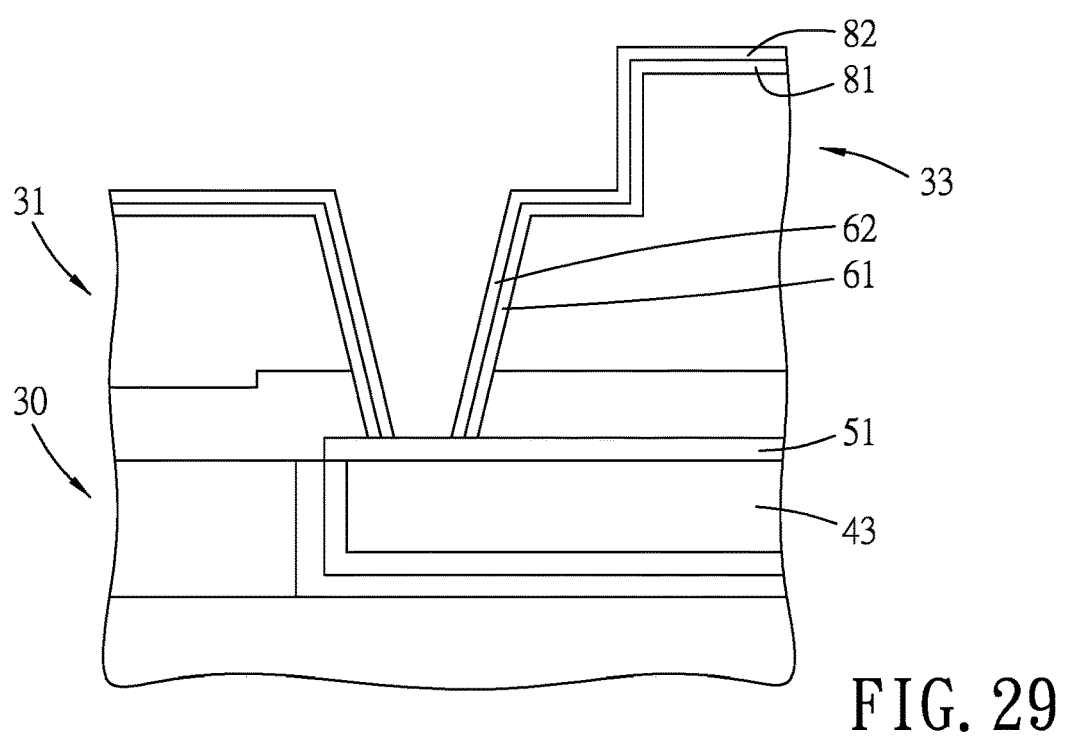

Referring to FIG. 29, the second barrier layer 61 and the third barrier layer 81 are respectively formed over the second dielectric feature 31 and the third dielectric feature 33 simultaneously, and are connected to each other. Then, the second liner layer 62 and the third liner layer 82 are respectively formed on the second barrier layer 61 and the third barrier layer 82 simultaneously, and are connected to each other.

Similar to the first cap element 51 described with reference to FIG. 6, the first cap element 51 shown in FIG. 29 also serves as the blocking layer to inhibit formation of the second barrier layer 61 and the second liner layer 62 thereon. The processes and materials for forming the second barrier layer 61, the second liner layer 62, the third barrier layer 81, the third liner layer 82 are similar to those obtained with reference to FIG. 6 or 18, and thus details thereof are omitted for the sake of brevity. As such, a portion of the first cap element 51 is exposed from the second liner layer 62.

Figure 30:
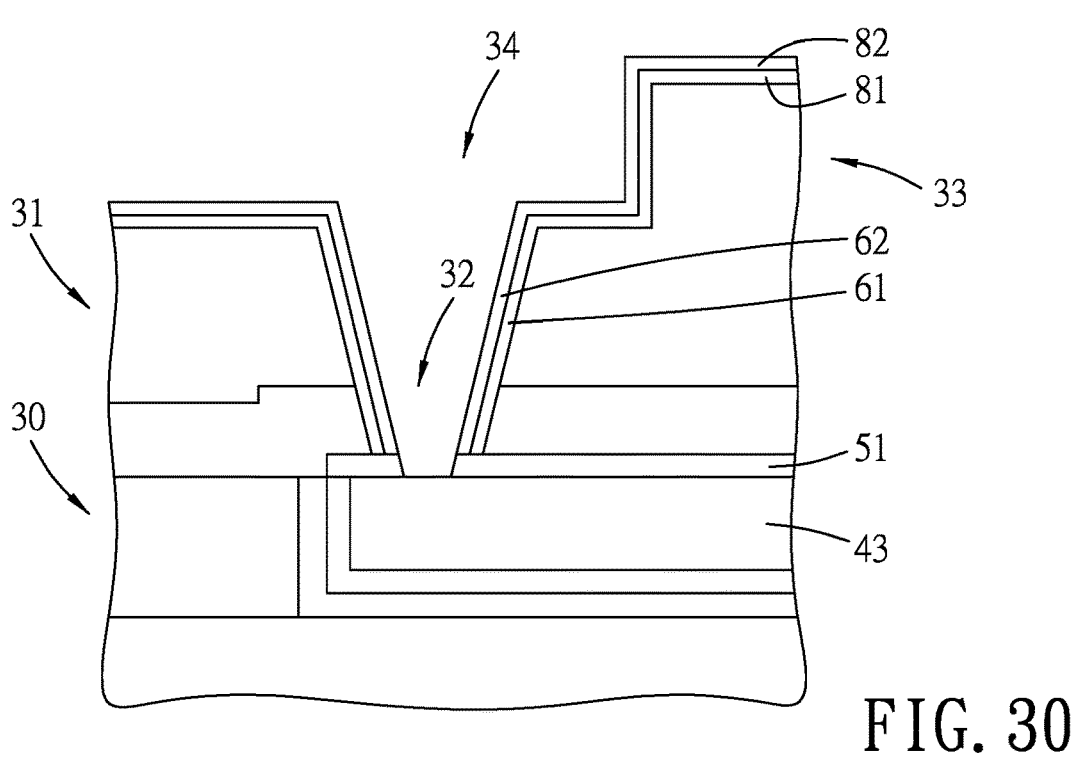

Referring to FIG. 30, the portion of the first cap element 51 exposed from the second liner layer 62 is removed in a manner similar to that as described with reference to FIG. 7, and thus the details thereof are omitted for the sake of brevity. A portion of the first conductive element 43 is then exposed from the remaining portion of the first cap element 51 through the first and second openings 32, 34.

Figure 31:
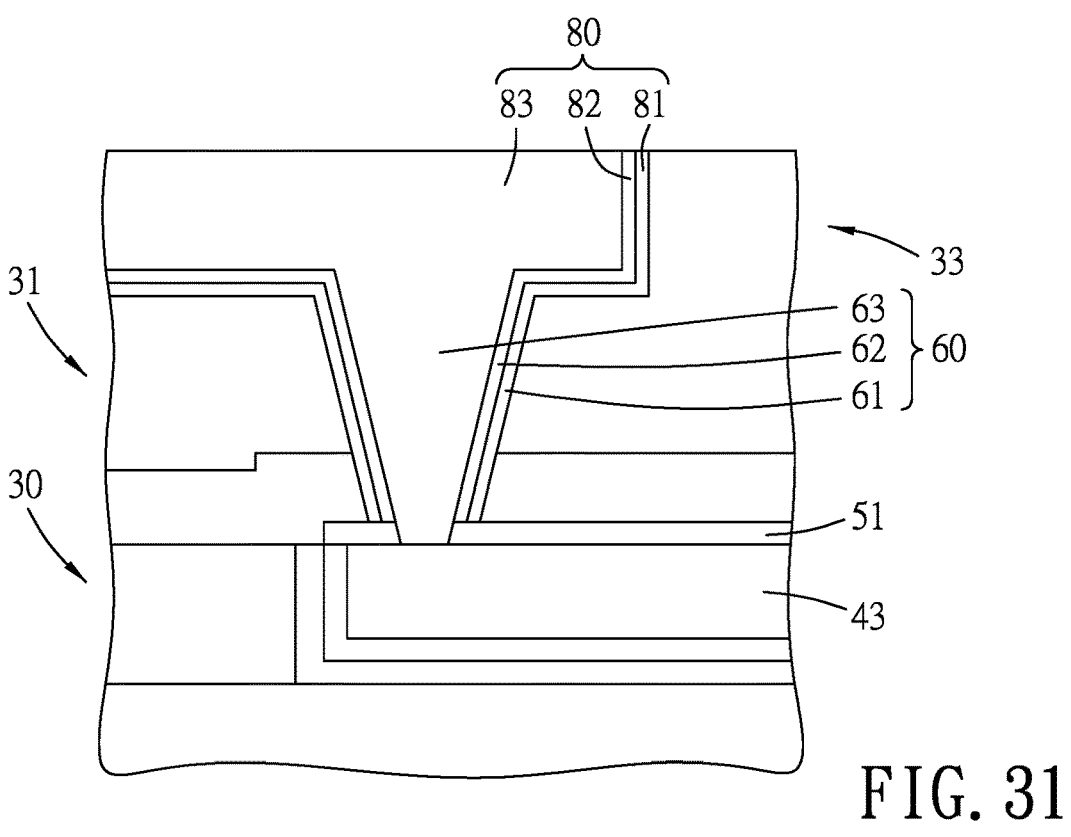

Referring to FIG. 31, the second conductive element 63 is formed in the first opening 32, and the third conductive element 83 is formed in the second opening 34 shown in FIG. 30 simultaneously using a dual damascene process, and the second and third conductive element 63, 83 are connected to each other.

In some embodiments, the second and third conductive element 63, 83 are formed by including the sub-steps of: (i) filling the conductive material for forming the second and third conductive elements 63, 83 into the first and second openings 32, 34 using a deposition process, such as PVD, CVD, ALD, ELD, ECP, or other suitable techniques such that the conductive material is in contact with the first conductive element 43; and (ii) performing CMP, to remove an excess amount of the conductive material and to expose the third liner layer 82 so as to obtain the second conductive element 63 and the third conductive elements 83. The CMP process may continue to further remove an excess amount of each of the third liner layer 82 and the third barrier layer 81 so as to expose the upper surface of the third dielectric feature 33. As such, the second interconnect feature 60 and the third interconnect feature 80 are formed, and the semiconductor structure in accordance with some embodiments of the present disclosure is thus obtained using the dual damascene process.

Referring to FIG. 31, similar to the second and third interconnect features 60, 80 obtained using two single damascene processes with reference to FIG. 20, for the second and third interconnect features 60, 80 obtained using the dual damascene process, the formation of the second barrier layer 61 and the second liner layer 62 is inhibited on the first cap element 51, so that the second barrier layer 61 and the second liner layer 62 are absent between the first and second conductive elements 43, 63, and thus low contact resistance is formed between the first and second conductive elements 43, 63. Thus, utilization of the first cap element 51 to form the second and third interconnect features 60, 80 with low contact resistance therebetween is applicable in both two single damascene processes and one dual damascene process, which one may choose according to layout design and practical needs.

In other embodiments that the second and third interconnect features 60, 80 are obtained using the dual damascene process, the first cap feature 50 may also include the metallic element 52 similar to that described with reference to FIG. 9, i.e., the metallic element 52 is first selectively formed on the first conductive element 43, as well as the first liner layer 42, followed by formation of the first cap element 51 on the metallic element 52. The material and process for formation of the metallic element 52 in such case is similar to those as described with reference to FIG. 9 and the details thereof are omitted for the sake of brevity. As such, for the second interconnect feature 60 obtained thereby, the second conductive element 63 is formed in the first opening 32 on the metallic element 52, and is electrically connected to the first conductive element 43 through the metallic element 52.

Description with reference to FIGS. 4 to 31 illustrates utilization of the first cap element 51 as the blocking layer to inhibit formation of both the second barrier layer 61 and the second liner layer 62 thereon, which is known as non-sequential inhibition. The utilization of the second cap element 71 to inhibit formation of both the third barrier layer 81 and the third liner layer 82 thereon is another example of the non-sequential inhibition.

In some embodiments, when the precursor for forming the second or third liner layer 62, 82 has a relatively high reactivity, an additional blocking layer 53 made of a material different from that of the first or second cap element 51, 71 is adopted to inhibit formation of the liner layer(s) thereon. Such inhibition is known as sequential inhibition. Sequential inhibition is applicable in both the two single damascene processes and the dual damascene process. Utilization of the dual damascene process is exemplified in FIGS. 32 to 38 which illustrate intermediate stages of sequential inhibition subsequent to the intermediate stage shown in FIG. 28, but is not limited thereto.

Figure 32:
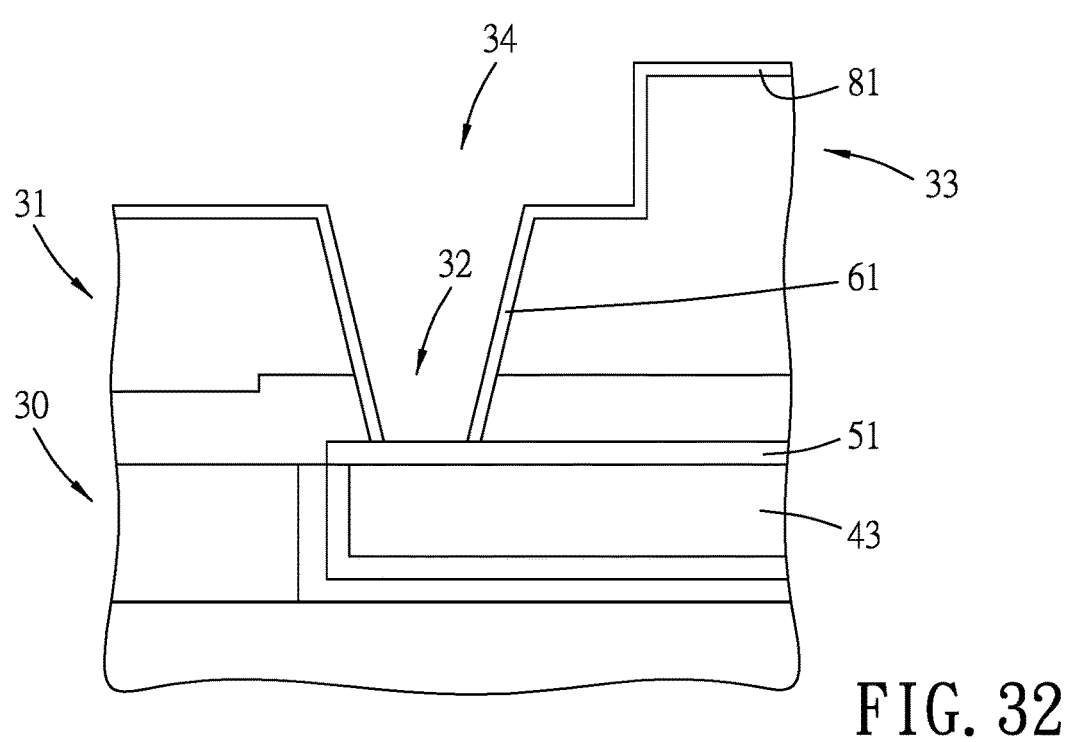

Referring to FIG. 32, the second and third barrier layers 61, 81 are simultaneously formed. The first cap element 51 inhibits formation of the second barrier layer 61 thereon, and a portion of the first cap element 51 is exposed from the second barrier layer 61. Materials and processes for formation of the second and third barrier layers 61, 81 are similar to those described with reference to FIG. 29, and the details thereof are omitted for the sake of brevity.

Figure 33:
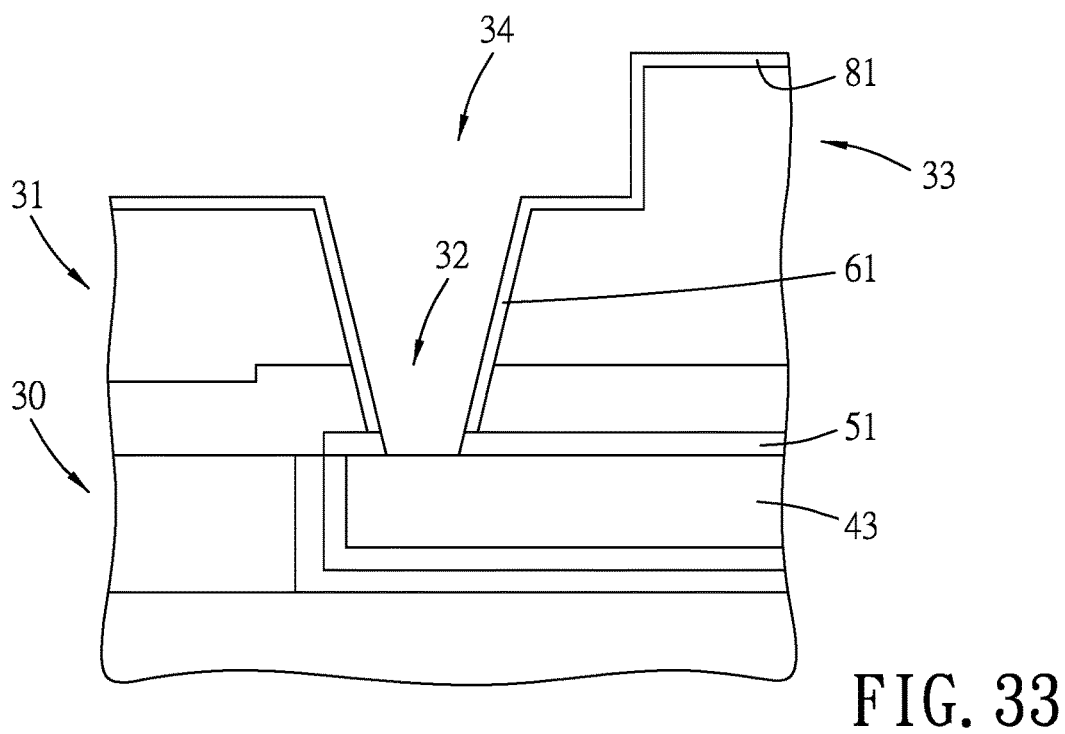

Referring to FIG. 33, the portion of the first cap element 51 exposed from the second barrier layer 61 is removed by any suitable processes using an etchant which has a higher etching selectivity to the material of the first cap element 51 than to that of the second and third barrier layers 61, 81. In some embodiments, the portion of the first cap element 51 is removed using a plasma etching process. A portion of the first conductive element 43 is then exposed from the remaining portion of the first cap element 51 through the first and second openings 32, 34.

Figure 34:
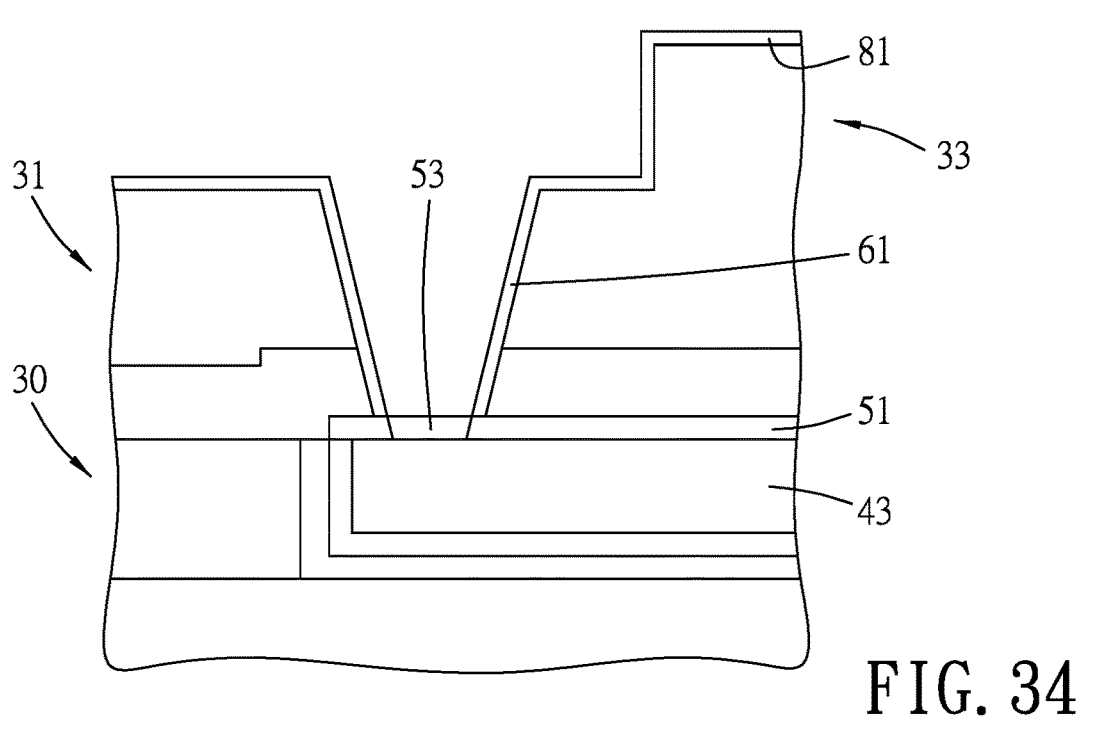

Referring to FIG. 34, the additional blocking layer 53 is formed on the first conductive element 43 in position at which the portion of the first cap element 51 is removed as shown in FIG. 33. The additional blocking layer 53 is made of a material which is different from that of the first cap element 51, which selectively deposits on the first conductive element 43, and which inhibits formation of the second liner layer 62 on the additional blocking layer 53. The additional blocking layer 53 may include a self-assembled monolayer (SAM) material. The SAM material may be an organic molecule having elements such as oxygen, nitrogen, phosphorus or sulphur that provide lone pair electrons to passivate a metallic material (in this case, the SAM material serves as an inhibitor), to thereby selectively deposit on the metallic material (i.e., the first conductive element 43). The organic molecule may be a small molecule having a relatively small molecular weight, or a polymer. In other embodiments, the additional blocking layer 53 may include an inorganic complex with ligands that can be selectively adsorbed on the metallic material so as to selectively deposit on the first conductive element 43. The additional blocking layer 53 may have a thickness ranging from about 5 Å to about 100 nm. The additional blocking layer 53 may be formed by any suitable processes, such as CVD, ALD, wet coating or immersion. Other suitable materials and/or processes and/or conditions for forming the additional blocking layer 53 are within the contemplated scope of the present disclosure.

Figure 35:
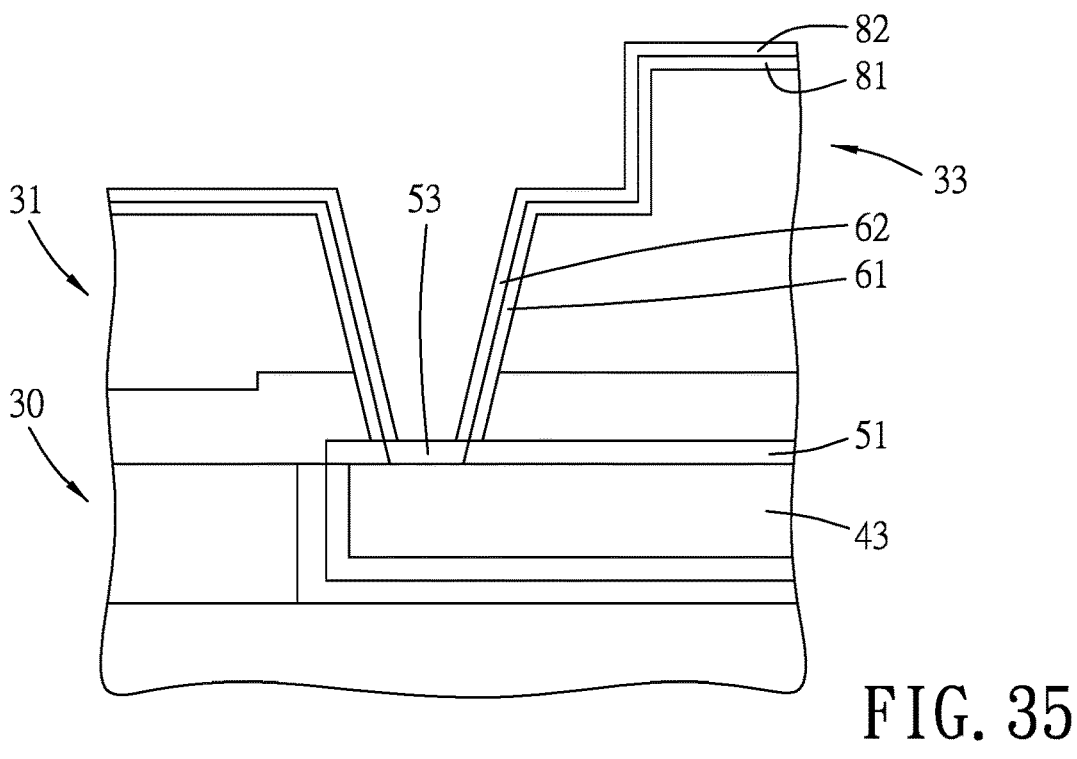

Referring to FIG. 35, the second and third liner layers 62, 82 are formed simultaneously on the second and the third barrier layers 61, 81, while the additional blocking layer 53 is exposed from the second liner layer 62. The additional blocking layer 53 serves as a blocking layer to inhibit formation of the second liner layer 62 thereon. Materials and processes for forming the second and third liner layers 62, 82 are similar to those described with reference to FIG. 29, and the details thereof are omitted for the sake of brevity.

Figure 36:
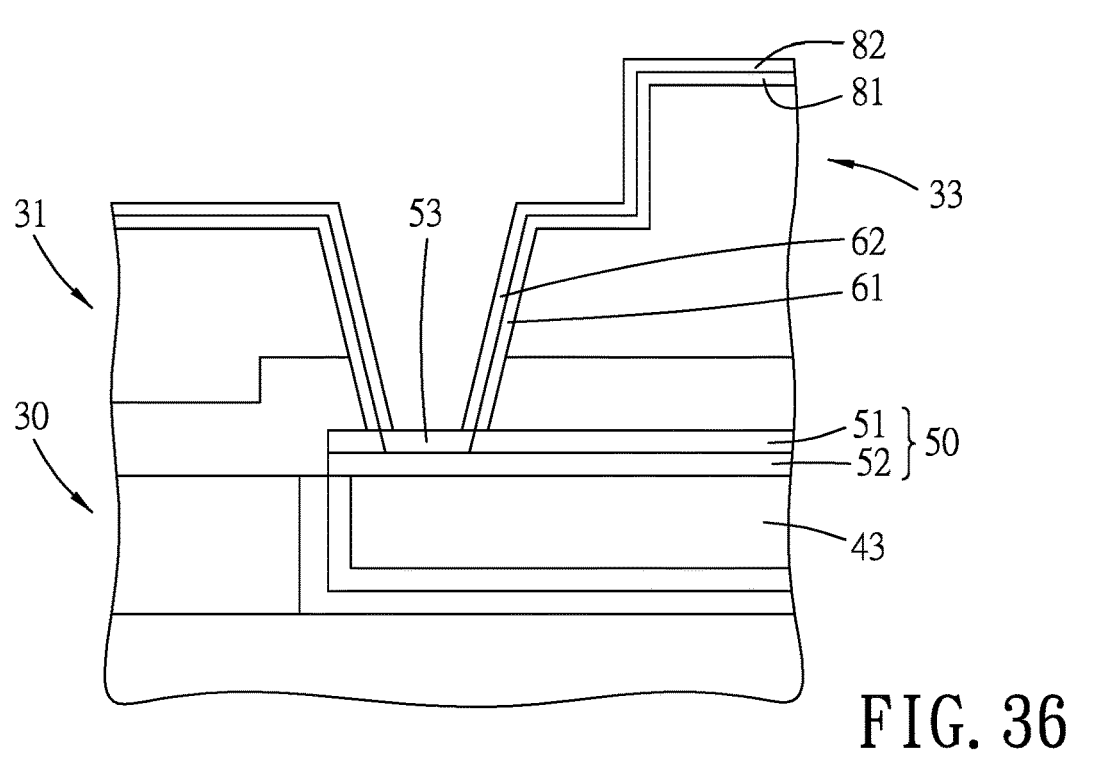

The structure shown in FIG. 36 is similar to that of FIG. 35, except that in FIG. 36, the first cap feature 50 further includes the metallic element 52 as described with reference to FIG. 9. The processes and materials for forming the first cap element 51 and the metallic element 52 are similar to those obtained with reference to FIG. 9, and details thereof are omitted for the sake of brevity. In certain embodiments, when sequential inhibition is used, the additional blocking layer 53 is selectively formed on the metallic element 52 in position at which the portion of the first cap element 51 is removed.

Figure 37:
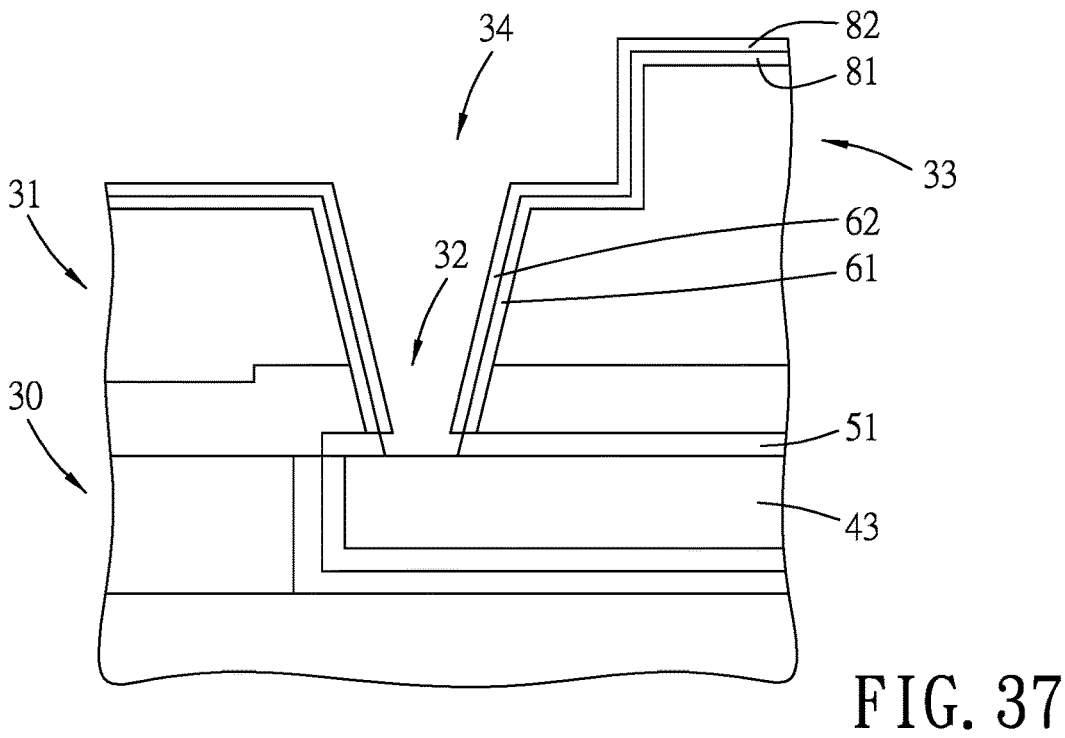

Referring to FIG. 37, which is subsequent to the intermediate stage shown in FIG. 35, the additional blocking layer 53 is removed. The removal of the additional blocking layer 53 may be performed using any suitable processes depending on material thereof. For instance, when the additional blocking layer 53 is made of an organic material, thermal degradation may be adopted by applying heat with a temperature greater than about 200° C. and less than about 400° C. (to satisfy the maximum temperature limitation for the BEOL process so as to protect other elements, such as the device feature 20 described with reference to FIG. 2). In other embodiments, the additional blocking layer 53 is removed by a plasma process using, for example but not limited to, a hydrogen ($H_2$) plasma. Other suitable processes for removing the additional blocking layer 53 are within the contemplated scope of the present disclosure.

Figure 38:
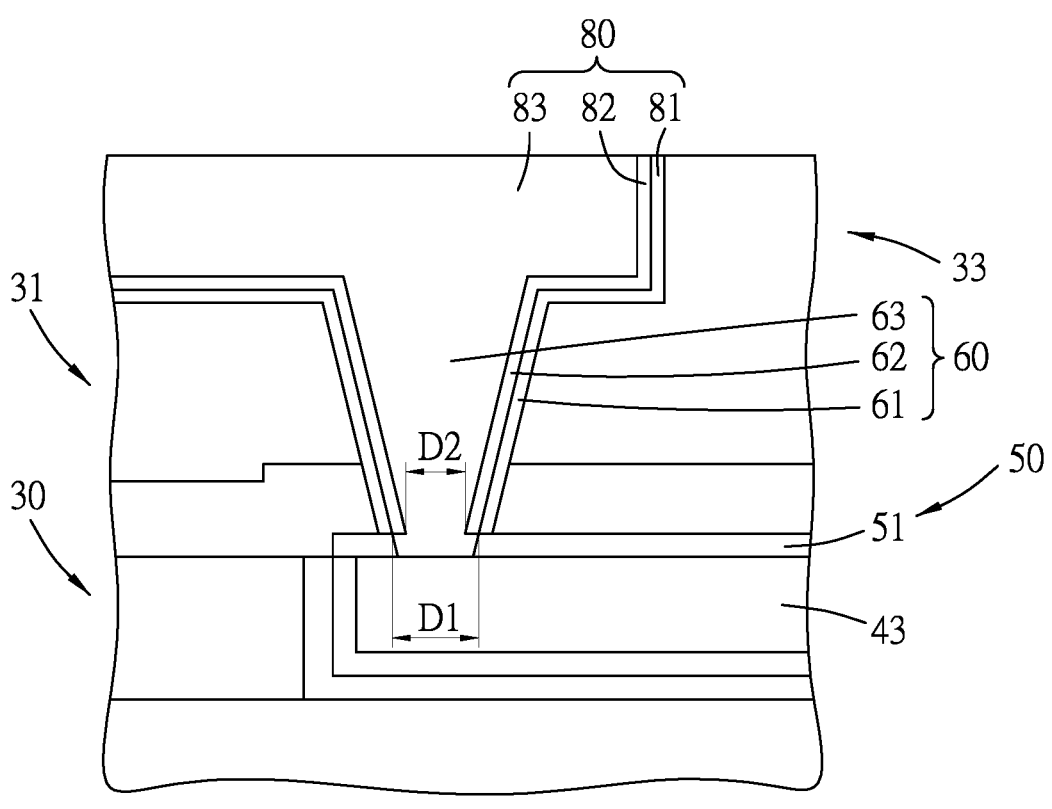

Referring to FIG. 38, the second and third conductive elements 63, 83 are respectively formed in the first opening 32 and the second opening 34 shown in FIG. 37 using a dual damascene process. Materials and processes for formation of the second and third conductive elements 63, 83 are similar to those described with reference to FIG. 31, and the details thereof are omitted for the sake of brevity. As such, the second interconnect feature 60 and the third interconnect feature 80 are formed, and the semiconductor structure in accordance with some embodiments of the present disclosure is thus obtained by sequential inhibition.

Referring to FIG. 38, for the second interconnect feature 60 obtained by sequential inhibition, the second conductive element 63 has a main region formed in the second dielectric feature 31, and an end region formed in the first cap element 51 of the first cap feature 50. A maximum dimension of the end region (D1) is larger than a minimum dimension of the main region (D2).

In the case that two single damascene processes are used for forming the second and third interconnect features 60, 80, sequential inhibition may also be applied in formation of the third barrier layer 81 and the third liner layer 82.

Description with reference to FIGS. 4 to 38 illustrates formation of the second and third interconnect features 60, 80, in which both the second barrier layer 61 and the second liner layer 62 are prevented from being in direct contact with the first conductive element 43, and when two single damascene processes are used, both the third barrier layer 81 and the third liner layer 82 are prevented from being in direct contact with the second conductive element 63.

In the following embodiments, the second liner layer 62 may be in direct contact with the first conductive element 43. That is, in other embodiments, the second liner layer 62 is formed immediately after removal of the portion of the first cap element 51 exposed from the second barrier layer 61, so that there is no inhibition on formation of the second liner layer 62. Similarly, in yet other embodiments, when two single damascene processes are used, the third liner layer 82 is formed immediately after removal of the portion of the second cap element 71 exposed from the third barrier layer 81, so that there is no inhibition on formation of the third liner layer 82. Using the dual damascene process method as an example, but not limited thereto, FIGS. 39 to 40 exemplarily illustrate intermediate stages subsequent to the intermediate stage shown in FIG. 33, i.e., after removal of the portion of the first cap element 51 exposed from the second barrier layer 61.

Figure 39:
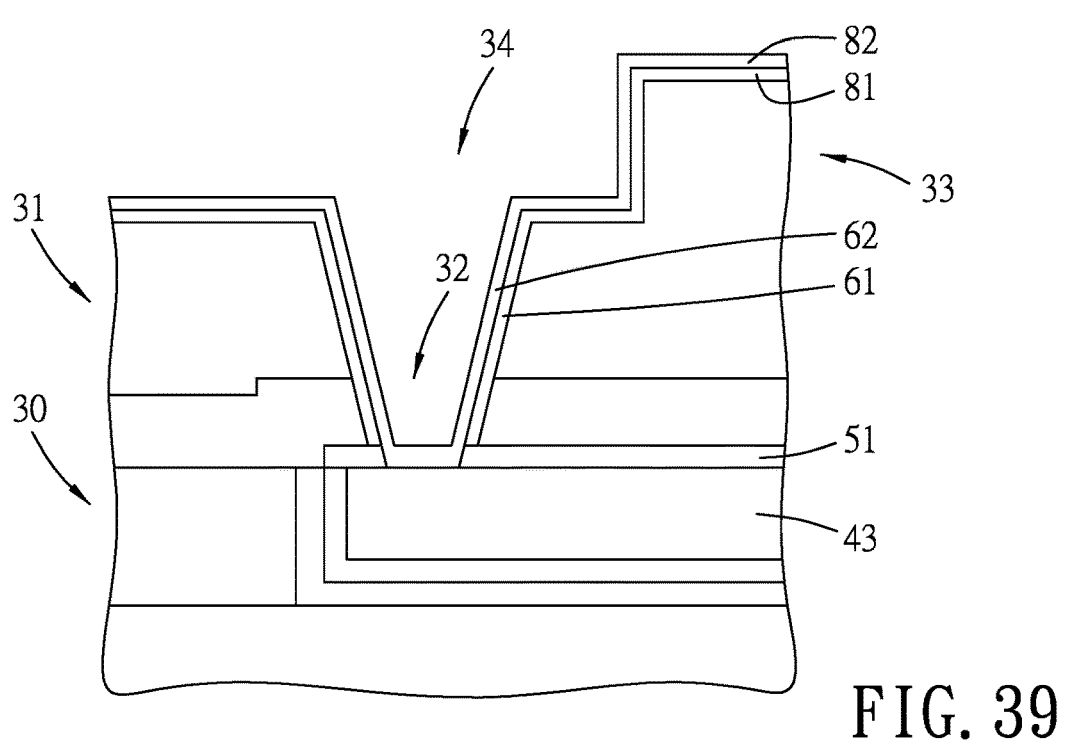

Referring to FIG. 39, the second and third liner layers 62, 82 are formed simultaneously over the second and third barrier layers 61, 81 and the portion of the first conductive element 43 exposed. Materials and processes for formation of the second and third liner layers 62, 82 are similar to the aforementioned with reference to FIG. 29, and are omitted for the sake of brevity. As such, the second liner layer 62 obtained has an end region which extends through the first cap element 51 to be in contact with the portion of the first conductive element 43 exposed.

Figure 40:
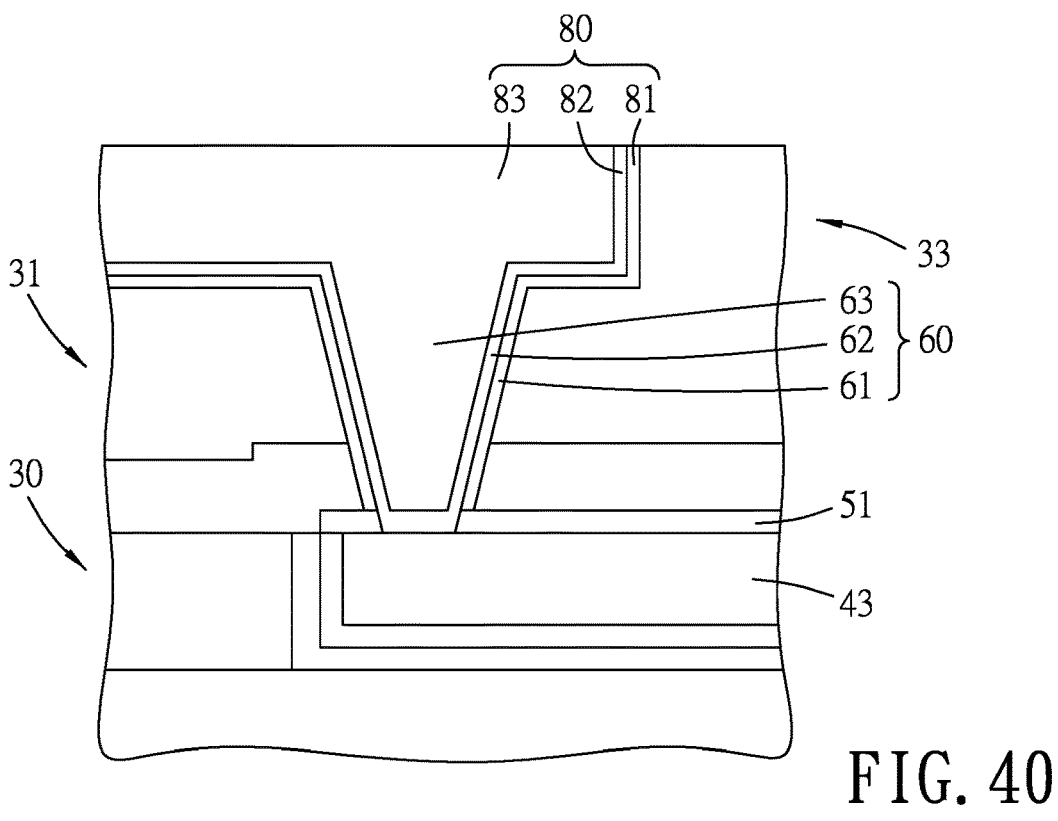

Referring to FIG. 40, the second and third conductive elements 63, 83 are formed respectively in the first opening 32 and the second opening 34 as shown in FIG. 39 using the dual damascene process. Materials and processes for formation of the second and third conductive elements 63, 83 are similar to those described with reference to FIG. 31, and the details thereof are omitted for the sake of brevity. As such, the second interconnect feature 60 and the third interconnect feature 80 are formed, and the semiconductor structure in accordance with some embodiments of the present disclosure is thus obtained.

Referring to FIG. 40, for the second interconnect feature 60 formed, the end region of the second liner layer 62 is disposed around an end region of the second conductive element 63. As such, the second conductive element 63 is electrically connected to the first conductive element 43 through the second liner layer 62.

The embodiments of the present disclosure have the following advantageous features. By using the first cap element as the blocking layer to inhibit formation of the second barrier layer directly on the first conductive element, in the semiconductor structure produced thereby, the second barrier layer is absent at the interface between the first and second conductive elements, so that a contact resistance formed at the interface between the first and second conductive elements is relatively low, which is conducive to enhance performance of the semiconductor structure. In addition, since the first cap element is made of the 2D material with a relatively low electrical resistance, an electrical resistance of the first conductive element is not substantially altered by the first cap element, and the first conductive element may have an increased resistance to electromigration, so that the semiconductor structure of the present disclosure may have an improved reliability.

In accordance with some embodiments of the present disclosure, a method for manufacturing a semiconductor structure includes: forming a first interconnect feature in a first dielectric feature, the first interconnect feature including a first conductive element exposed from the first dielectric feature; forming a first cap feature over the first conductive element, the first cap feature including a first cap element which includes a two-dimensional material; forming a second dielectric feature with a first opening that exposes the first cap element; forming a barrier layer over the second dielectric feature while exposing the first cap element from the barrier layer; removing a portion of the first cap element exposed from the barrier layer; and forming a second conductive element in the first opening.

In accordance with some embodiments of the present disclosure, the two-dimensional material includes graphene.

In accordance with some embodiments of the present disclosure, the first cap feature further includes a metallic element, and forming the first cap feature includes forming the metallic element over the first conductive element, followed by forming the first cap element over the metallic element.

In accordance with some embodiments of the present disclosure, the method further includes: forming a third dielectric feature with a second opening in position corresponding to the second conductive element; forming another barrier layer over the third dielectric feature; and forming a third conductive element in the second opening so that the third conductive element is electrically connected to the second conductive element.

In accordance with some embodiments of the present disclosure, the method further includes: prior to forming the third dielectric feature, forming a second cap feature over the second conductive element, the second cap feature including a second cap element which includes graphene such that after forming the third dielectric feature, the second cap element is exposed from the third dielectric feature, and such that after forming the another barrier layer, the second cap element is exposed from the another barrier layer; and prior to forming the third conductive element, removing a portion of the second cap element exposed from the another barrier layer.

In accordance with some embodiments of the present disclosure, a method for manufacturing a semiconductor structure includes: forming a first interconnect feature in a first dielectric feature, the first interconnect feature including a first conductive element exposed from the first dielectric feature; forming a blocking layer over the first conductive element; forming a second dielectric feature with an opening that exposes a portion of the blocking layer; forming a barrier layer over the second dielectric feature while formation of the barrier layer on the portion of blocking layer is inhibited; removing the portion of the blocking layer; and forming a second conductive element in the opening.

In accordance with some embodiments of the present disclosure, after forming the barrier layer and prior to forming the second conductive element in the opening, the method further includes forming a liner layer over the barrier layer.

In accordance with some embodiments of the present disclosure, formation of the liner layer is performed after removing the portion of the blocking layer.

In accordance with some embodiments of the present disclosure, formation of the liner layer is performed before removing the portion of the blocking layer, and formation of the liner layer on the portion of blocking layer is inhibited.

In accordance with some embodiments of the present disclosure, formation of the liner layer is performed after removing the portion of the blocking layer, the method further includes, after removing the portion of the blocking layer and prior to forming the second conductive element in the opening, forming an additional blocking layer in position at which the portion of the blocking layer is removed, the additional blocking layer being made of a material different from that of the blocking layer; forming a liner layer over the barrier layer while formation of the liner layer on the additional blocking layer is inhibited; and removing the additional blocking layer.

In accordance with some embodiments of the present disclosure, after removing the portion of the blocking layer, a portion of the first conductive element is exposed; and the blocking layer is made of graphene, and the additional blocking layer is made of a material that selectively deposits on the first conductive element and that inhibits formation of the liner layer on the additional blocking layer.

In accordance with some embodiments of the present disclosure, the method further includes forming a metallic element between the blocking layer and the first conductive element such that after removing the portion of the blocking layer, a portion of the metallic element is exposed, wherein the blocking layer is made of graphene, and the additional blocking layer is made of a material that selectively deposits on the metallic element and that inhibits formation of the liner layer on the additional blocking layer.

In accordance with some embodiments of the present disclosure, a semiconductor structure includes: a first dielectric feature, a first interconnect feature, a first cap feature, a second dielectric feature, and a second interconnect feature. The first interconnect feature is disposed in the first dielectric feature and includes a first conductive element exposed from the first dielectric feature. The first cap feature includes a first cap element disposed on the first conductive element, and the first cap element includes a two-dimensional material. The second dielectric feature is disposed over the first dielectric feature, the first cap feature and the first interconnect feature, and the second dielectric feature has an upper surface distal from the first dielectric feature, and a lower surface opposite to the upper surface. The second interconnect feature includes a conductive portion extending through the second dielectric feature and the first cap element, and a barrier layer extending from the upper surface to terminate at the lower surface of the second dielectric feature such that the conductive portion is separated from the second dielectric feature through the barrier layer, and such that the barrier layer is absent between the first conductive element and the conductive portion.

In accordance with some embodiments of the present disclosure, the two-dimensional material includes graphene.

In accordance with some embodiments of the present disclosure, the first cap feature further includes a metallic element which is disposed between the first cap element and the first conductive element, such that the conductive portion is in direct contact with the metallic element.

In accordance with some embodiments of the present disclosure, the metallic element includes one of copper, cobalt, ruthenium, aluminum copper, cobalt tungsten, ruthenium cobalt, and combinations thereof.

In accordance with some embodiments of the present disclosure, the conductive portion includes a second conductive element and a liner layer disposed between the second conductive element and the barrier layer.

In accordance with some embodiments of the present disclosure, the liner layer has an end region which extends through the first cap element and which is disposed around an end region of the second conductive element.

In accordance with some embodiments of the present disclosure, the second conductive element extends through the first cap element, and the liner layer is absent between the first conductive element and the second conductive element.

In accordance with some embodiments of the present disclosure, the second conductive element has a main region formed in the second dielectric feature, and an end region formed in the first cap element, a maximum dimension of the end region being larger than a minimum dimension of the main region.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first interconnect feature in a first dielectric feature, the first interconnect feature including a first conductive element exposed from the first dielectric feature;

forming a first cap feature over the first conductive element, the first cap feature including a first cap element which includes a two-dimensional material, the first cap element having a first surface facing the first conductive element, and a second surface opposite to the first surface;

forming a second dielectric feature with a first opening that exposes the first cap element;

forming a barrier layer over the second dielectric feature while exposing the first cap element from the barrier layer;

after forming the barrier layer, removing a portion of the first cap element exposed from the barrier layer so that the first cap element has a through hole extending from the second surface to the first surface; and forming a second conductive element in the first opening and the through hole, wherein the first cap feature further includes a metallic element which is formed over the first conductive element prior to forming the first cap element, and wherein after removing the portion of the first cap element, the metallic element remains to prevent exposure of the first conductive element through the through hole.

2. The method according to claim 1, wherein the two-dimensional material includes graphene.

3. The method according to claim 1, further comprising:

forming a third dielectric feature with a second opening in position corresponding to the second conductive element;

forming another barrier layer over the third dielectric feature; and forming a third conductive element in the second opening so that the third conductive element is electrically connected to the second conductive element.

4. The method according to claim 3, further comprising:

prior to forming the third dielectric feature, forming a second cap feature over the second conductive element, the second cap feature including a second cap element which includes graphene such that after forming the third dielectric feature, the second cap element is exposed from the third dielectric feature, and such that after forming the another barrier layer, the second cap element is exposed from the another barrier layer; and prior to forming the third conductive element, removing a portion of the second cap element exposed from the another barrier layer.

5. The method according to claim 1, wherein the second conductive element is connected to the first conductive element through the metallic element.

6. A method for manufacturing a semiconductor structure, comprising:

forming a first interconnect feature in a first dielectric feature, the first interconnect feature including a first conductive element exposed from the first dielectric feature;

forming a blocking layer over the first conductive element;

forming a second dielectric feature with an opening that exposes a portion of the blocking layer;

performing a selective deposition process to form a barrier layer in a manner that a material of the barrier layer is selectively deposited on the second dielectric feature without being deposited on the portion of the blocking layer;

after the selective deposition process, removing the portion of the blocking layer; and forming a second conductive element in the opening.

7. The method according to claim 6, after forming the barrier layer and prior to forming the second conductive element in the opening, further comprising forming a liner layer over the barrier layer.

8. The method according to claim 7, wherein formation of the liner layer is performed after removing the portion of the blocking layer.

9. The method according to claim 7, wherein formation of the liner layer is performed before removing the portion of the blocking layer, and formation of the liner layer on the portion of blocking layer is inhibited.

10. The method according to claim 7, wherein formation of the liner layer is performed after removing the portion of the blocking layer, the method further comprising, after removing the portion of the blocking layer and prior to forming the second conductive element in the opening, forming an additional blocking layer in position at which the portion of the blocking layer is removed, the additional blocking layer being made of a material different from that of the blocking layer;

forming a liner layer over the barrier layer while formation of the liner layer on the additional blocking layer is inhibited; and removing the additional blocking layer.

11. The method according to claim 10, wherein after removing the portion of the blocking layer, a portion of the first conductive element is exposed; and the blocking layer is made of graphene, and the additional blocking layer is made of a material that selectively deposits on the first conductive element and that inhibits formation of the liner layer on the additional blocking layer.

12. The method according to claim 10, further comprising forming a metallic element between the blocking layer and the first conductive element such that after removing the portion of the blocking layer, a portion of the metallic element is exposed, wherein the blocking layer is made of graphene, and the additional blocking layer is made of a material that selectively deposits on the metallic element and that inhibits formation of the liner layer on the additional blocking layer.

13. A method for manufacturing a semiconductor structure, comprising:

forming a first interconnect feature in a first dielectric feature, the first interconnect feature including a first conductive element exposed from the first dielectric feature;

forming a first cap feature including a first cap element disposed on the first conductive element, the first cap element including a two-dimensional material;

forming a second dielectric feature over the first dielectric feature, the first cap feature and the first interconnect feature, the second dielectric feature having an upper surface distal from the first dielectric feature, and a lower surface opposite to the upper surface, the second dielectric feature including a three-dimensional material; and forming a second interconnect feature including forming a conductive portion extending through the second dielectric feature and the first cap element, prior to forming the conductive portion, forming a barrier layer extending from the upper surface to terminate at the lower surface of the second dielectric feature such that the conductive portion is separated from the second dielectric feature through the barrier layer, the barrier layer being formed by a selective deposition process in a manner that the barrier layer is selectively deposited on the three-dimensional material without being deposited on the two-dimensional material such that the barrier layer is absent between the first conductive element and the conductive portion, and after forming the barrier layer and prior to forming the conductive portion, removing a portion of the first cap element exposed from the barrier layer such that the conductive portion is formed to extend through the first cap element.

14. The method according to claim 13, wherein the two-dimensional material includes graphene.

15. The method according to claim 13, wherein the first cap feature further includes a metallic element which is disposed between the first cap element and the first conductive element, the conductive portion being connected to the first conductive element through the metallic element.

16. The method according to claim 15, wherein the metallic element includes one of copper, cobalt, ruthenium, aluminum copper, cobalt tungsten, ruthenium cobalt, and combinations thereof.

17. The method according to claim 13, wherein forming the conductive portion includes depositing a second conductive element, and prior to depositing the second conductive element, depositing a liner layer so that after depositing the second conductive element, the liner layer is disposed between the second conductive element and the barrier layer.

18. The method according to claim 17, wherein the liner layer has an end region which extends through the first cap element and which is disposed around an end region of the second conductive element.

19. The method according to claim 17, wherein the second conductive element extends through the first cap element, and the liner layer is absent between the first conductive element and the second conductive element.

20. The method according to claim 19, wherein the second conductive element has a main region formed in the second dielectric feature, and an end region formed in the first cap element, a maximum dimension of the end region being larger than a minimum dimension of the main region.

* * * * *